United States Patent
Lai et al.

(10) Patent No.: US 12,505,880 B2
(45) Date of Patent: Dec. 23, 2025

(54) MEMORY DEVICE AND METHOD FOR FORMING THE SAME

(71) Applicant: MACRONIX INTERNATIONAL CO., LTD., Hsinchu (TW)

(72) Inventors: Erh-Kun Lai, Taichung (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 378 days.

(21) Appl. No.: 18/310,593

(22) Filed: May 2, 2023

(65) Prior Publication Data

US 2024/0371443 A1    Nov. 7, 2024

(51) Int. Cl.
| | |
|---|---|
| H10B 43/35 | (2023.01) |
| G11C 16/04 | (2006.01) |
| H01L 23/522 | (2006.01) |
| H01L 23/528 | (2006.01) |
| H10B 41/27 | (2023.01) |
| H10B 41/35 | (2023.01) |
| H10B 43/27 | (2023.01) |

(52) U.S. Cl.
CPC ...... *G11C 16/0483* (2013.01); *H01L 23/5226* (2013.01); *H01L 23/5283* (2013.01); *H10B 41/27* (2023.02); *H10B 41/35* (2023.02); *H10B 43/27* (2023.02); *H10B 43/35* (2023.02)

(58) Field of Classification Search
CPC ........ H10B 41/27; H10B 41/35; H10B 41/50; H10B 43/27; H10B 43/35; H10B 43/10; H10B 43/40; H10B 43/50; G11C 16/0483; H01L 23/5226; H01L 23/5283
See application file for complete search history.

(56) References Cited

U.S. PATENT DOCUMENTS

| | | | |
|---|---|---|---|
| 7,816,255 B2 | 10/2010 | Choi et al. | |
| 2021/0082513 A1* | 3/2021 | Ogawa | G11C 7/22 |
| 2021/0090665 A1* | 3/2021 | Funatsuki | G11C 16/0483 |
| 2021/0280601 A1* | 9/2021 | Kashiyama | H10B 41/30 |
| 2021/0304810 A1* | 9/2021 | Lee | G11C 11/4085 |
| 2021/0375340 A1* | 12/2021 | Young | G11C 7/12 |
| 2022/0068389 A1* | 3/2022 | Takekida | G11C 16/08 |

FOREIGN PATENT DOCUMENTS

| | | |
|---|---|---|
| TW | 200901289 A | 1/2009 |
| TW | 201628130 A | 8/2016 |
| TW | 201926642 A | 7/2019 |

* cited by examiner

*Primary Examiner* — Moazzam Hossain
(74) *Attorney, Agent, or Firm* — McClure, Qualey & Rodack, LLP

(57) ABSTRACT

An integrated circuit structure includes a substrate, a first memory string, a source line, and a second memory string. The first memory string is over the substrate and comprises first memory cells stacked in a vertical direction. The source line laterally extends over the first memory string. The second memory string is over the source line and comprises second memory cells stacked in the vertical direction.

17 Claims, 28 Drawing Sheets

MEMORY DEVICE AND METHOD FOR FORMING THE SAME

BACKGROUND

Field of Invention

The present invention relates to a memory device. More particularly, the present invention relates to a method for forming a memory device.

Description of Related Art

The present disclosure generally relates to semiconductor devices, and particularly to methods of making a 3-dimensional (3D) memory device.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

SUMMARY

The invention provides an integrated circuit (IC) structure includes an integrated circuit structure includes a substrate, a first memory string, a source line, and a second memory string. The first memory string is over the substrate and comprises first memory cells stacked in a vertical direction. The source line laterally extends over the first memory string. The second memory string is over the source line and comprises second memory cells stacked in the vertical direction.

In some embodiments, the first memory string comprises a first channel layer extending in the vertical direction and having an innermost position in contact with a first surface of the source line.

In some embodiments, the second memory string comprises a second channel layer vertically extending in the vertical direction and having an innermost position in contact with a second surface of the source line opposite to the first surface of the source line.

In some embodiments, the second channel layer is spaced apart from the first channel layer by the source line.

In some embodiments, the IC structure further includes a first bit line and a second bit line. The first bit line laterally extends between the substrate and the first memory string and is electrically connected to the first memory string. The second bit line laterally extends above the second memory string and is electrically connected to the second memory string.

In some embodiments, the first and second bit lines are made of a same material.

In some embodiments, the first and second bit lines comprise copper.

In some embodiments, the substrate comprises a complementary metal oxide semiconductor (CMOS) device.

In some embodiments, the IC structure further includes a deep via vertically extending through the source line, and electrically connected the first and second memory strings to the CMOS device.

In some embodiments, the IC structure further includes a metal plug vertically extending through the source line, and electrically connected the first and second memory strings to the CMOS device.

The invention provides a method for forming an integrated circuit structure. The method includes forming a first multi-layered stack, the first multi-layered stack comprising first insulating layers stacked in a vertical direction and spaced apart from each other; forming a first memory layer vertically extending through the first multi-layered stack; forming a first channel layer on the first memory layer; forming a source line laterally extending over the first multi-layered stack; forming a second multi-layered stack over the source line, the second multi-layered stack comprising second insulating layers stacked in the vertical direction and spaced apart from each other; forming a second memory layer vertically extending through the second multi-layered stack; forming a second channel layer on the second memory layer; forming first gate layers alternately stacked with the first insulating layers, and second gate layers alternately stacked with the second insulating layers in the vertical direction.

In some embodiments, forming the source line is performed after forming the first channel layer.

In some embodiments, the source line is made of doped polysilicon.

In some embodiments, the method further includes forming a first interconnect structure over the second multi-layered stack from a side of the second multi-layered stack opposite to the source line.

In some embodiments, the method further includes bonding a complementary metal oxide semiconductor (CMOS) wafer to the first interconnect structure.

In some embodiments, the method further includes forming a deep VIA vertically extending through, the first interconnect structure, the first and second multi-layered stacks and the source line, the deep via electrically connected the first and second memory strings to the CMOS wafer.

In some embodiments, the method further includes forming a metal plug vertically extending through first and second multi-layered stacks and the source line, the metal plug electrically connected the first and second memory strings to the CMOS wafer.

In some embodiments, the method further includes forming a second interconnect structure over the first multi-layered stack from a side of the first multi-layered stack opposite to the source line.

In some embodiments, the first interconnect structure comprises a first bit line, the second interconnect structure comprises a second bit line, the first and second bit line are made of copper.

In some embodiments, forming the second interconnect structure is performed after forming the first interconnect structure.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
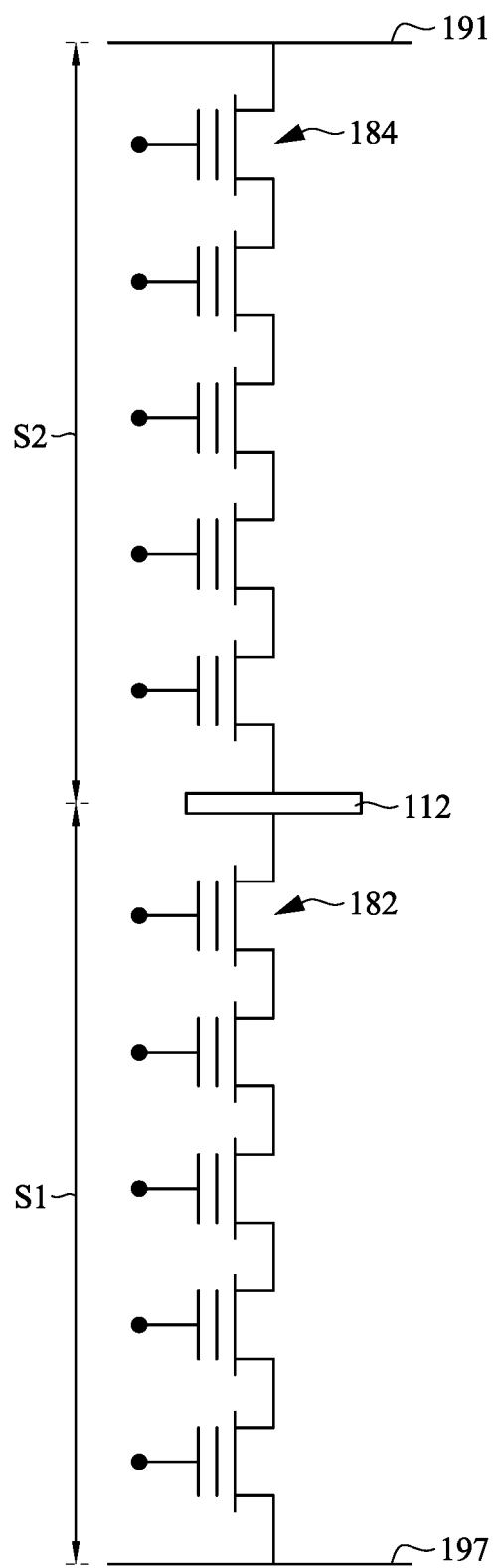
FIG. 1A is a schematic diagram illustrating a memory circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

For next generation semiconductor devices, it is desirable to include memories that can provide high density storage. Therefore, a 3-dimensional (3D) integrated circuit (IC) memory device, such as 3D NAND can provide high density storage by its multi-layered structure, in which complementary metal oxide semiconductors (CMOS) can be disposed under the memory array (CuA). However, the more layers in 3D NAND are stacked, the longer the string length, which may result in lower current in the NAND.

Therefore, the present disclosure in various embodiments provides a 3D NAND having a source line formed in the middle of the memory string, which in turn reduces the string length, such that the current in the NAND can be increased. For example, if the string length is halved, the current in the NAND can be doubled. In other words, if the number of strings in the same column of the NAND array is divided into n, the current can become n times the original. In addition, once the memory array is formed, the top bit line, the bottom bit line, and the CMOS wafer can be bonded to the bottom and/or the top of the memory array. Therefore, before the bonding, the 3D NAND can be formed in a high thermal budget process without impacting the top bit line, the bottom bit line, and the CMOS wafer, which in turn allows for improving the performance of the IC structure. Other the other hand, after forming of the 3D NAND, the top bit line and the bottom bit line can be formed by a back end of line (BEOL) process, which in turn improved the RC of the IC structure.

Figure 1B:
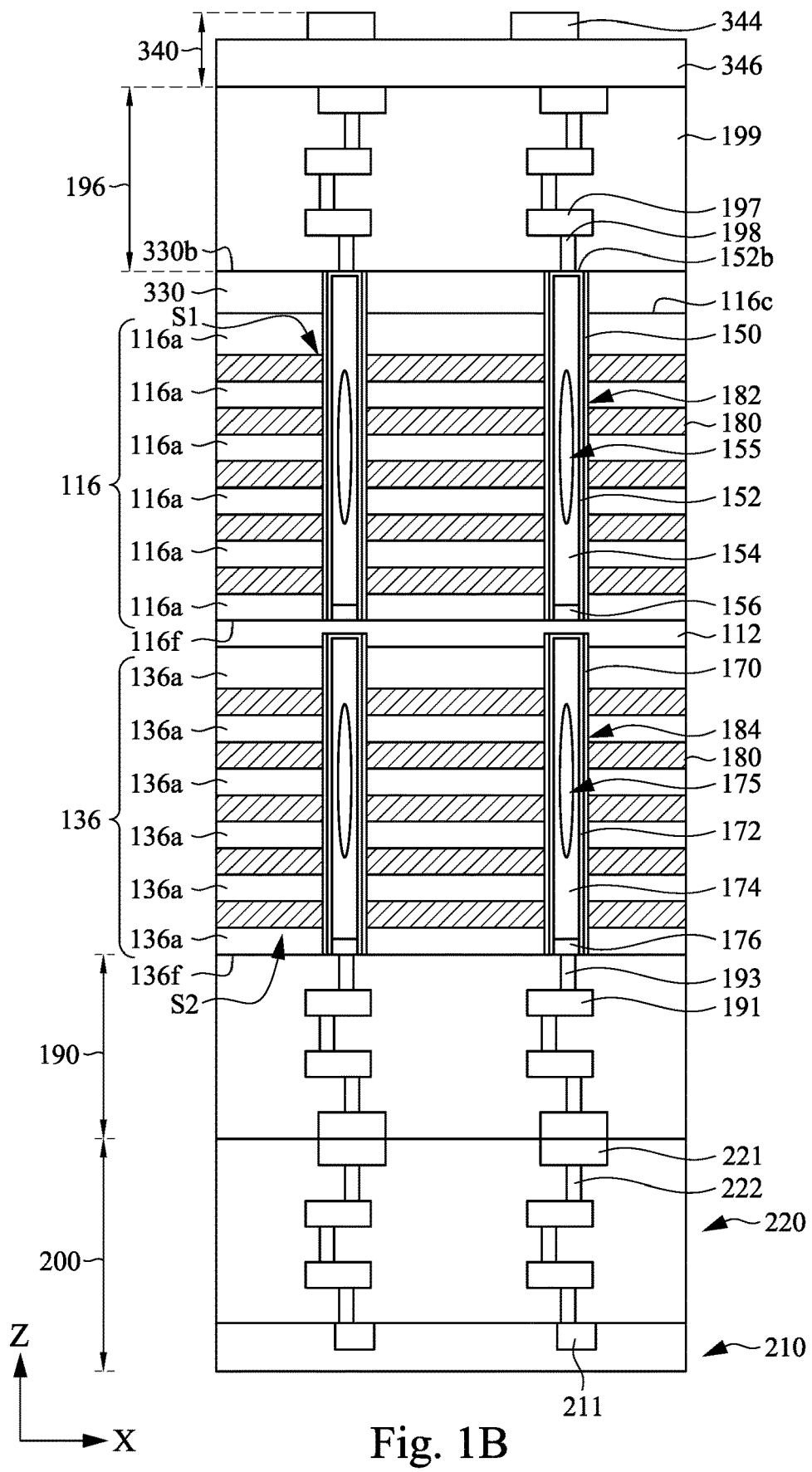
FIG. 1B is a cross-sectional view of an IC structure in accordance with some embodiments of the present disclosure.

Reference is made to FIGS. 1A and 1B. FIG. 1A is a schematic diagram illustrating a memory circuit in accordance with some embodiments of the present disclosure. FIG. 1B illustrates a cross-sectional view of an integrated circuit (IC) structure according to some embodiments of the present disclosure. A plurality of memory cells 182 are defined at the points of intersection between the gate layers 180, the memory layers 150, and the channel layers 152, and a plurality of memory cells 184 can be defined at the points of intersection between the gate layers 180, the memory layers 170, and the channel layers 172, so as to form a memory cell array in the first and second multi-layered stacks 116 and 136. The gate layers 180 are spaced apart from each other by the insulating layers 136a and 116a. The semiconductor layer 112 is between the memory cells 182 and 184 and electrically connected to the memory cells 182 and 184. In some embodiments, the semiconductor layer 112 can be interchangeably referred to a common semiconductor layer or a common source line.

In some embodiments, the memory cells 182 in the same column can be referred to as a subsidiary memory string S1, the memory cells 184 in the same column can be referred to as a subsidiary memory string S2, and the subsidiary memory strings S1 and S2 can be collectively referred to as a memory string. That is, the source line (i.e., semiconductor layer 112) is formed in the middle of the memory string, which in turn reduces the string length, such that the current in the NAND can be increased. For example, if the string length is halved, the current in the NAND can be doubled. In other words, if the number of strings (e.g., subsidiary memory strings S1 and S2 as shown in FIG. 1B) in the same column of the NAND array is divided into n, the current can become n times the original.

As shown in FIG. 1B, an interconnect structure 190 is formed over a front-side surface 136f of the multi-layered stack 136. In some embodiments, the interconnect structure 190 may include, for example, three metallization layers 191, with three layers of metallization vias 193. Other embodiments may contain more or fewer metallization layers and corresponding more or fewer number of vias. In some embodiments, the metallization layer 191 can interchangeably referred to a bottom bit line (BL). Also included in the interconnect structure 190 is a plurality of inter-metal dielectric (IMD) layers. In some embodiments, the plurality of IMD layers can be collectively referred to as an IMD structure 195. The IMD structure 195 may provide electrical insulation as well as structural support for the various features of the integrated circuit during many fabrication process steps. In some embodiments, the topmost metal layer in the interconnect structure 190 can be interchangeably referred to a bonding layer.

As shown in FIG. 1B, the IC structure 200 is formed over the interconnect structure 190. The interconnect structure 190 includes a semiconductor substrate 210 and an interconnect structure 220 formed on the semiconductor substrate 210. In some embodiments, the semiconductor substrate 210 may include complementary metal-oxide-semiconductor (CMOS) devices 211 therein. In some embodiments, the interconnect structure 220 may include, for example, three metallization layers 221, with three layers of metallization vias 222. Other embodiments may contain more or fewer metallization layers and corresponding more or fewer number of vias. Also included in the interconnect structure 220 is a plurality of inter-metal dielectric (IMD) layers. In some embodiments, the plurality of IMD layers can be collectively referred to as an IMD structure 223. The IMD structure 223 may provide electrical insulation as well as structural support for the various features of the integrated circuit during many fabrication process steps.

As shown in FIG. 1B, a dielectric layer 330 can laterally surround an end portion of the channel layer 152, and a back-side surface 330b of the dielectric layer 330 can be in a position level with the back-side surface 152b of the channel layer 152. An interconnect structure 196 is formed over the back-side surface 116c of the multi-layered stack 116 and electrically connected to the channel layer 152 of the memory cell 182. In some embodiments, the interconnect structure 196 may include, for example, three metallization layers 197, with three layers of metallization vias 198. Other embodiments may contain more or fewer metallization layers and corresponding more or fewer number of vias. In some embodiments, the metallization layer 197 can interchangeably referred to a top bit line (BL).

Also included in the interconnect structure 196 is a plurality of inter-metal dielectric (IMD) layers. In some embodiments, the plurality of IMD layers can be collectively referred to as an IMD structure 199. The IMD structure 199 may provide electrical insulation as well as structural support for the various features of the integrated circuit during many fabrication process steps. In some embodiments, the topmost metal layer in the interconnect structure 196 can be interchangeably referred to a bonding layer. In some embodiments, the interconnect structure 196 can be formed in accordance with a back end of line (BEOL) scheme.

Figure 24A:
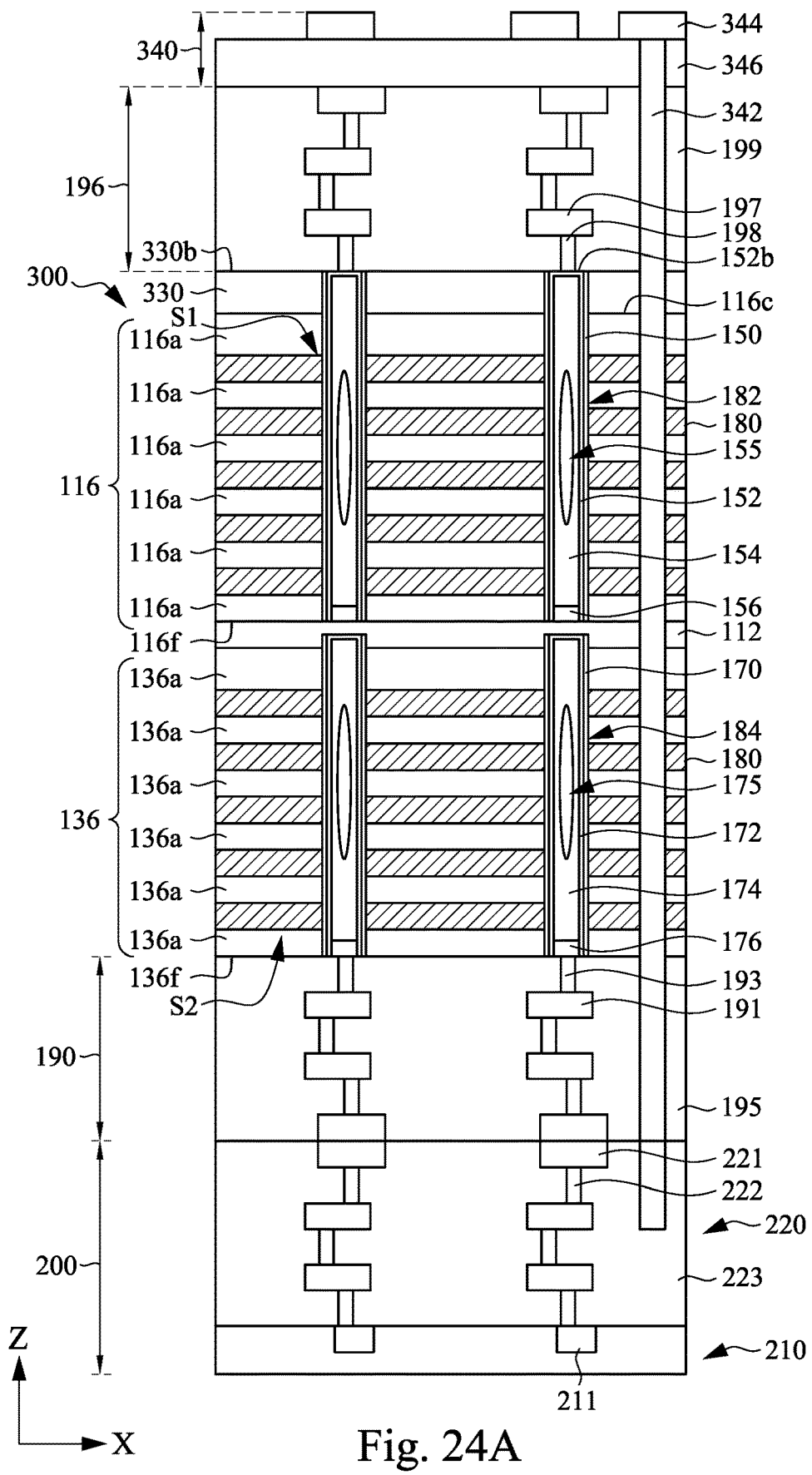

An interconnect structure 340 is formed over the interconnect structure 196 and electrically connected to the interconnect structure 196. The interconnect structure 340 include a deep via. The deep via (see deep via 342 as shown in FIG. 24A) is formed to extend from an outermost metallization layer 344 in the interconnect structure 340 through the interconnect structure 196, and the multi-layered stacks 116 and 136 to a metallization layer 191 in the interconnect structure 190, such that the deep via can electrically connect the memory cells 182 and 184 to the semiconductor device in the IC structure 200. Also included in the interconnect structure 340 is a plurality of inter-metal dielectric (IMD) layers. In some embodiments, the plurality of IMD layers can be collectively referred to as an IMD structure 346. The IMD structure 346 may provide electrical insulation as well as structural support for the various features of the integrated circuit during many fabrication process steps. In some embodiments, the topmost metal layer in the interconnect structure 346 can be interchangeably referred to a bonding layer.

Figure 2A:
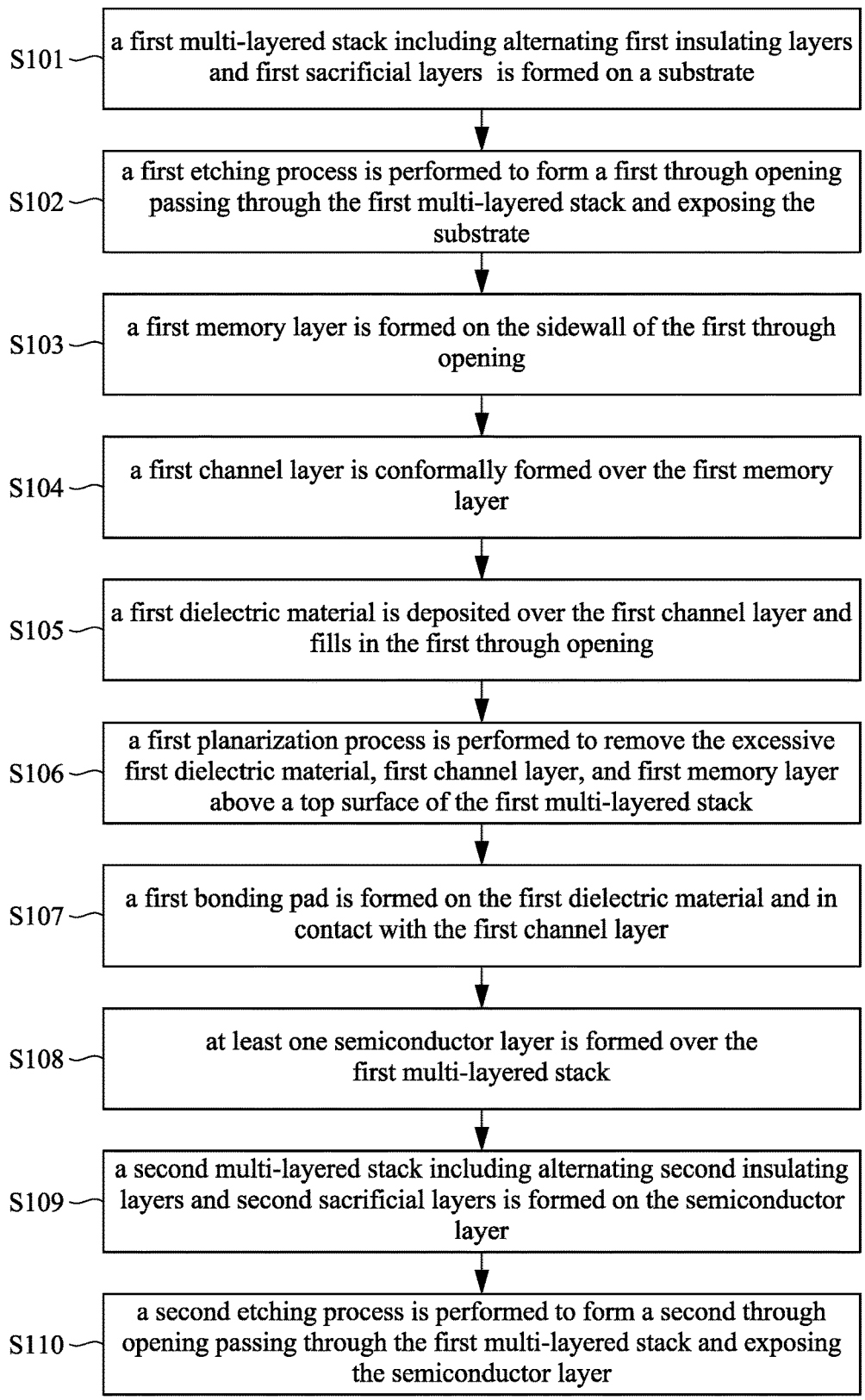
FIGS. 2A-2C are a flowchart of a method for forming an IC structure in accordance with some embodiments of the present disclosure.
Figure 2B:
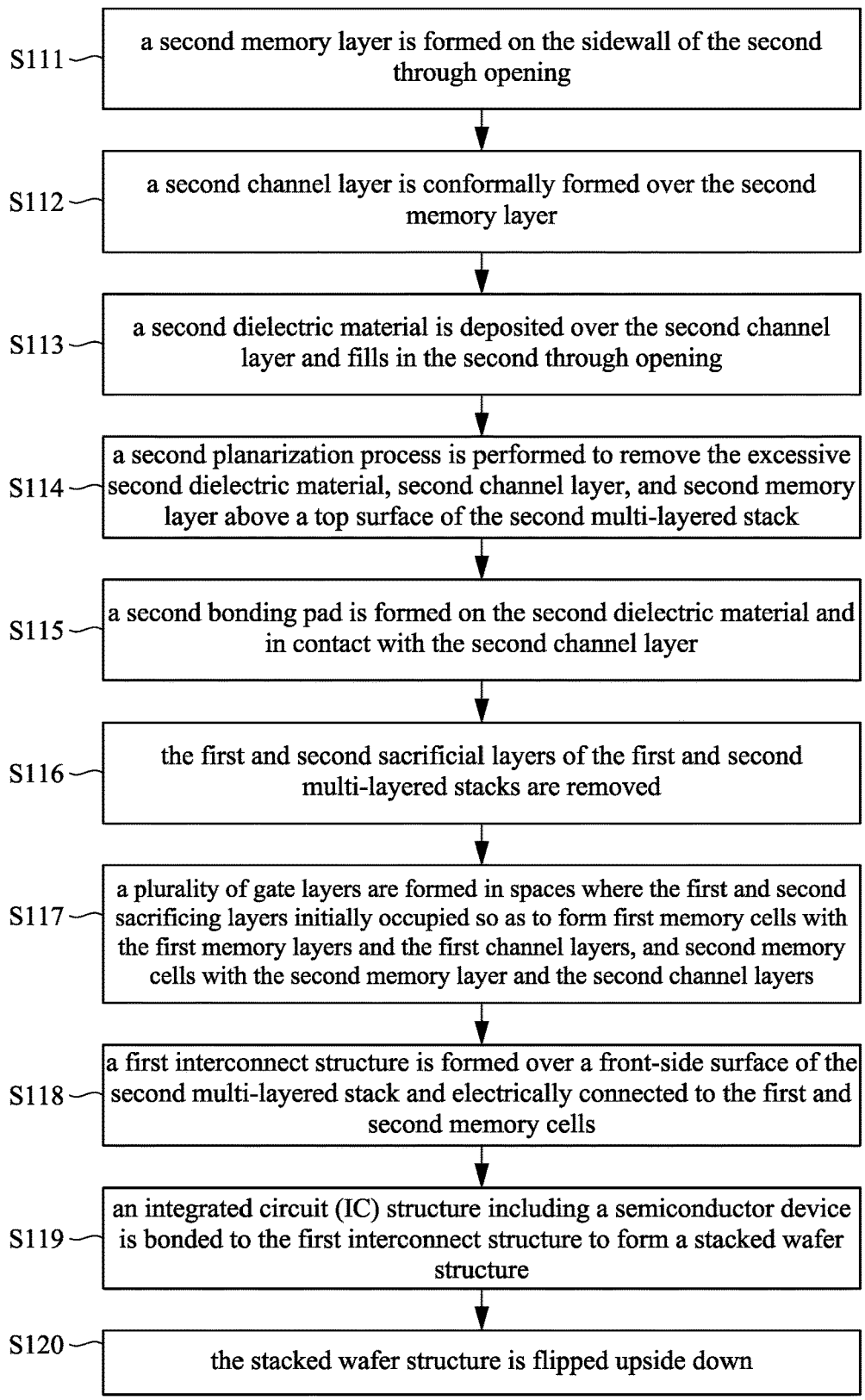
Figure 2C:
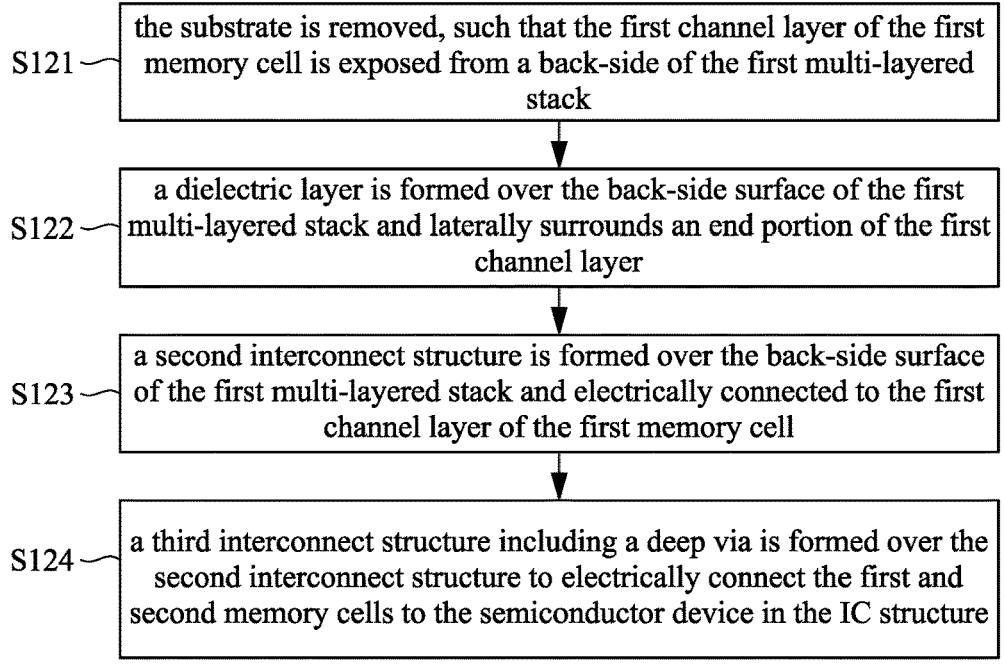

Referring now to FIGS. 2A-2C, illustrated is a flowchart of an exemplary method M for fabrication of a IC structure in accordance with some embodiments. The method M includes a relevant part of the entire manufacturing process. It is understood that additional operations may be provided before, during, and after the operations shown by FIGS. 2A-2C, and some of the operations described below can be replaced or eliminated for additional embodiments of the method. The order of the operations/processes may be interchangeable. The method M includes fabrication of a memory device (e.g., NAND memory devices). However, the fabrication of the memory device is merely an example for describing the manufacturing process according to some embodiments of the present disclosure.

Figure 3:
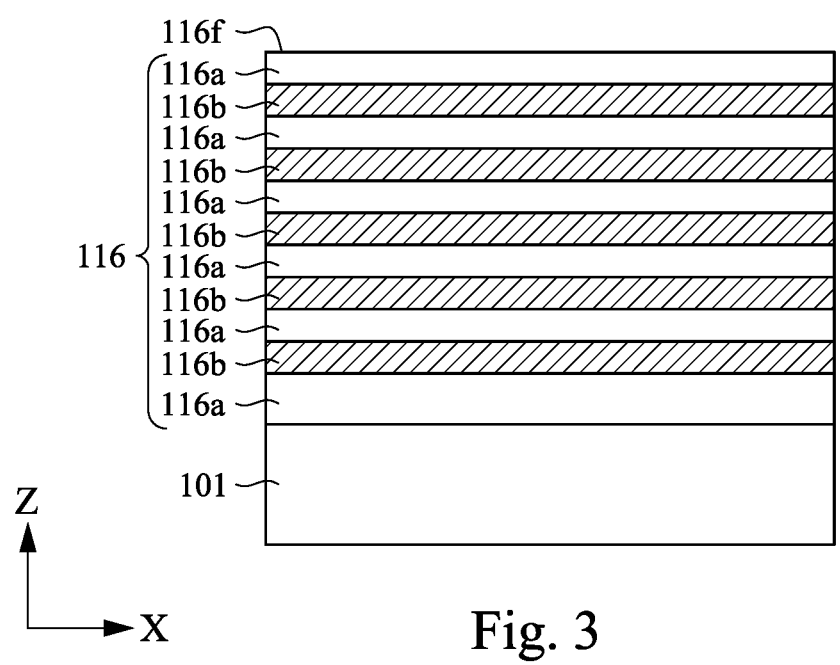
FIGS. 3-24B illustrate cross-sectional of a method in various stages of forming an IC structure in accordance with some embodiments of the present disclosure.

FIGS. 3 to 24A illustrate the method M in various stages of forming an IC structure in accordance with some embodiments of the present disclosure. In some embodiments, the IC structure includes a vertical channel flash memory array. The method M begins at block S101. Referring to FIG. 3, in some embodiments of block S101, a multi-layered stack 116 including alternating insulating layers 116a and sacrificial layers 116b is formed on a substrate 101. The substrate 101 can be a semiconductor substrate, such as a monocrystalline silicon bulk semiconductor, a semiconductor-on-insulator (SOI) substrate, or the like, which may be doped (e.g., with a p-type or an n-type impurity) or undoped. The SOI substrate can a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the substrate 101 may be a carrier wafer, such as a lower cost wafer or a reclaim wafer. The substrate 101 may have a round top-view shape or a rectangular top-view shape.

In some embodiments, the semiconductor material of the substrate 101 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; the like; or combinations thereof.

The insulating layers 116a and the sacrificial layers 116b are parallel to each other and alternatively stacked on the substrate 101 along Z-direction. In some embodiments, the multi-layered stack 116 can be interchangeably referred to a film stack or a deck of ON pairs. However, it should be appreciated that, in the embodiments of the present disclosure, the sacrificing layers 116b and the insulating layers 116a are made of different material. For example, the sacrificial layers 116b may be made of silicon nitride, and the insulating layers 116a may be made of silicon oxide. In some embodiments, a topmost layer of the insulating layers 116a can be interchangeably referred to a hard mask oxide layer. In some embodiments, the sacrificial layers 116b and the insulating layers 116a can be formed by low pressure chemical vapor deposition (LPCVD) process.

Figure 4:
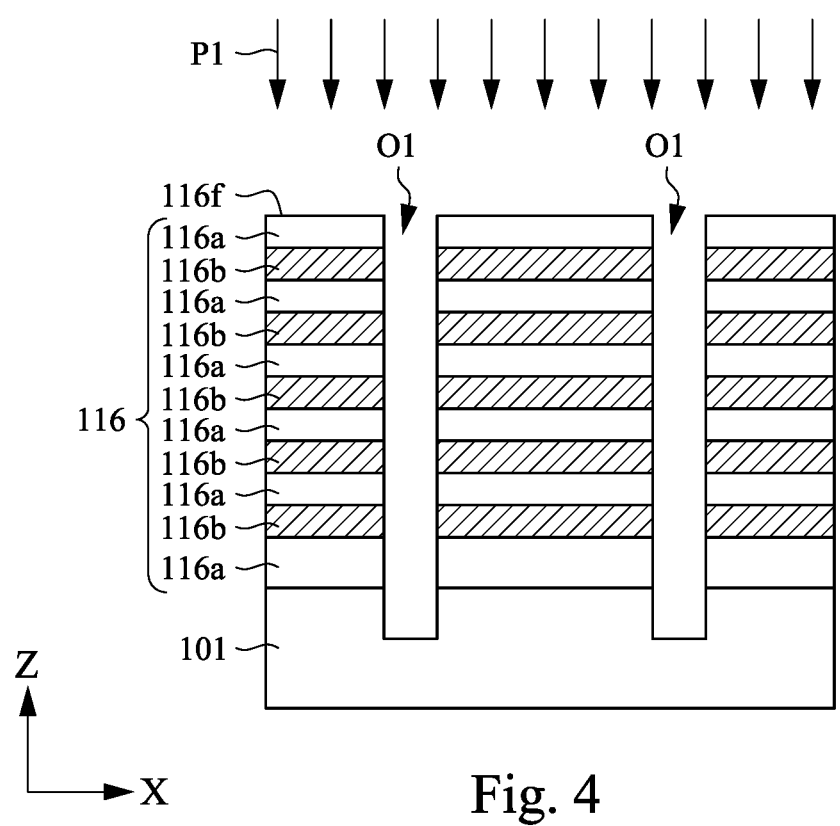

Referring back to FIG. 2A, the method M then proceeds to block S102 where a first etching process is performed to form a first through opening passing through the first multi-layered stack 116 and exposing the substrate. With reference to FIG. 4, in some embodiments of block S102, an etching process P1, such as a hole etch process, is performed on the multi-layered stack 116 to form a plurality of through openings O1 passing through the multi-layered stack 116 and exposing the substrate 101. In some embodiments, the etching process P1 can be an anisotropic etching process, such as a reactive ion etching (RIE) process, performed on the multi-layered stack 116 using a patterned hard mask layer as an etching mask formed on the multi-layered stack 116. In some embodiments, the through openings O1 may be a plurality of circular through holes passing through the multi-layered stack 116 along Z-direction and terminate at the substrate 101. The through opening O1 expose portion of the sacrificial layers 116b and the insulating layers 116a serving as the sidewall thereof. In some embodiments, the through opening O1 can be interchangeably referred to as a vertical channel opening.

Figure 5:
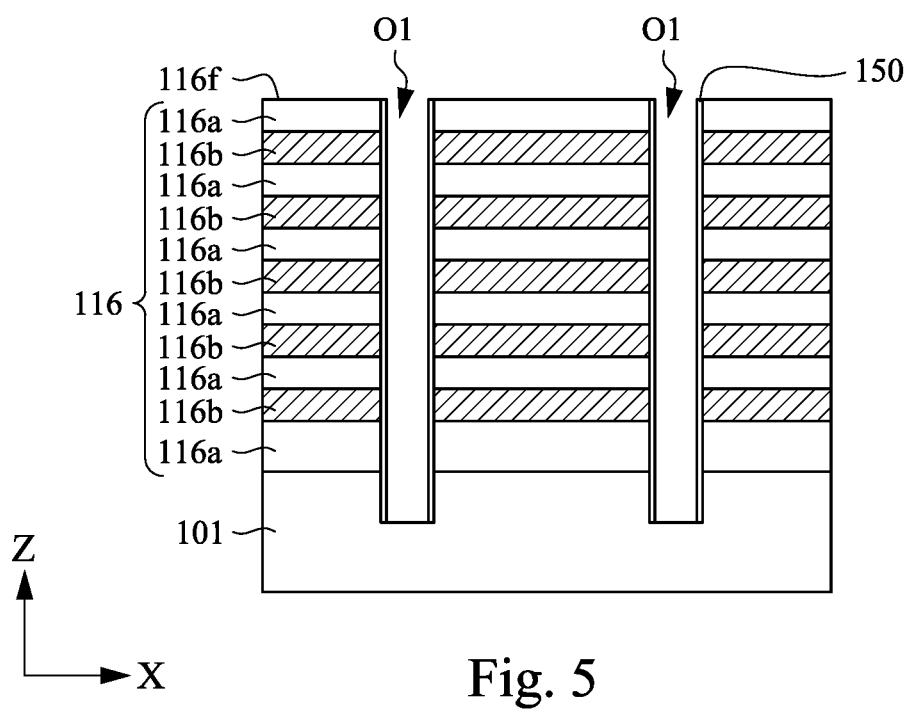

Referring back to FIG. 2A, the method M then proceeds to block S103 where a first memory layer is formed on the sidewall of the first through opening. With reference to FIG. 5, in some embodiments of block S103, a memory layer 150 is conformally deposited over the multi-layered stack 116 and on the sidewall and bottom of the through opening O1. In some embodiments, the memory layer 150 may include a composite layer having (but not limited to) oxide-nitride-oxide (ONO), oxide-nitride-oxide-nitride-oxide (ONONO) or oxide-nitride-oxide-nitride-oxide-nitride-oxide (ONONONO) structure. Subsequently, an etching process is performed to remove portions of the composite layer disposed on a front-side surface 116f of the multi-layered stack 116 and on the bottom of the through opening O1 to form the memory layer 150.

Figure 6:
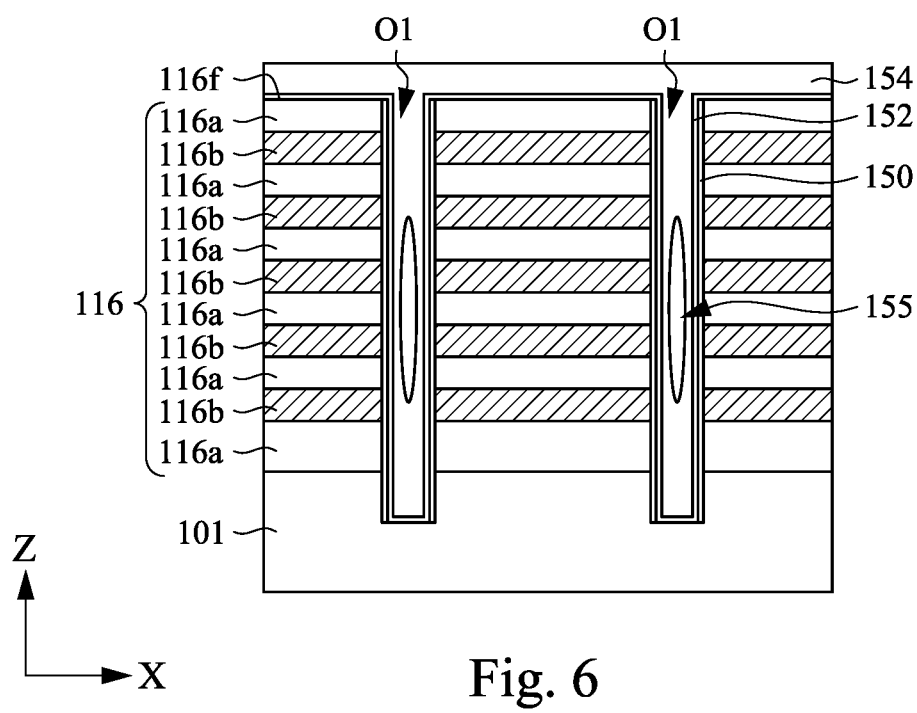

Referring back to FIG. 2A, the method M then proceeds to block S104 where a first channel layer is conformally formed over the first memory layer. With reference to FIG. 6, in some embodiments of block S104, a channel layer 152 is deposited conformally over the memory layer 150 and has an U-shaped cross-sectional profile in the through opening O1, and thus the IC structure may include a vertical channel flash memory device. The memory layer 150 is disposed between the channel layer 152 and the sacrificial layers 116b. In some embodiments, the memory layer 150 may be made of semiconductor material, such as such as poly-silicon (Si), Ge or other doped/undoped semiconductor material. For example, the channel layer 152 may be made of doped poly-silicon.

Referring back to FIG. 2A, the method M then proceeds to block S105 where a first dielectric material is deposited over the first channel layer and fills in the first through opening. With reference to FIG. 6, in some embodiments of block S105, a dielectric material 154 is deposited over the channel layer 152 and fills in the through opening O1. In some embodiments, the dielectric material 154 may be made of, such as silicon dioxide ($SiO_2$). In some embodiments, at least one air gap 155 may be formed in the filled through opening O1. In some embodiments, the dielectric material 154 may be made of a same material as the insulating layers 116a. In some embodiments, the dielectric material 154 may be made of a different material than the insulating layers 116a.

Figure 7:
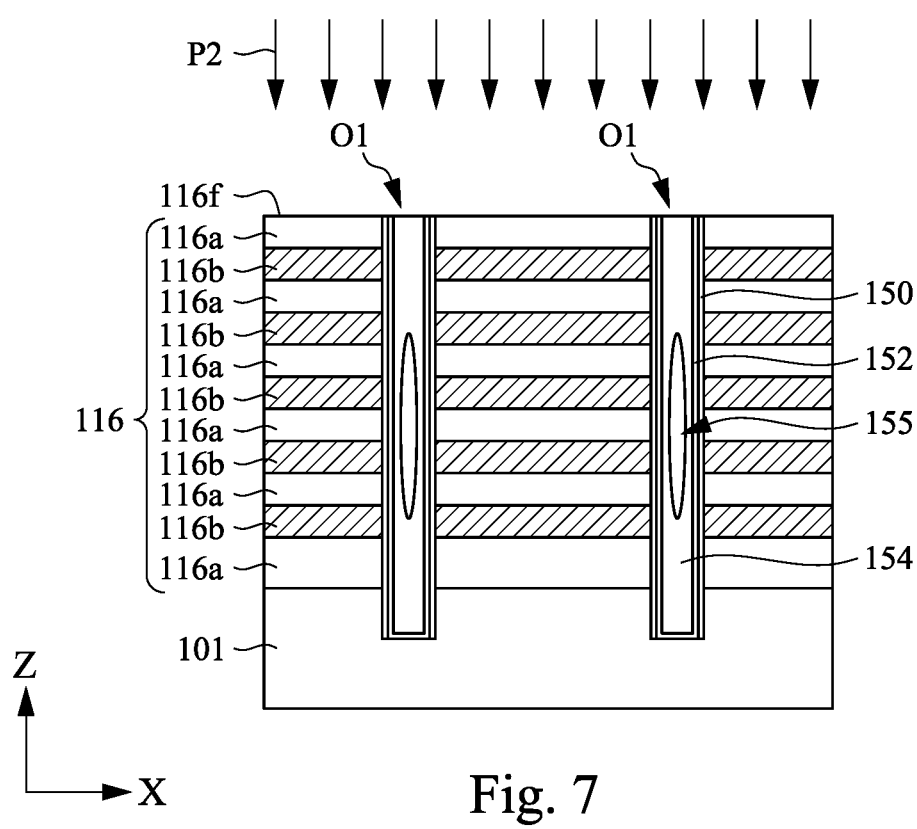

Referring back to FIG. 2A, the method M then proceeds to block S106 where a first planarization process is performed to remove the excessive first dielectric material, first channel layer, and first memory layer above a top surface of the first multi-layered stack 116. With reference to FIG. 7, in some embodiments of block S106, a planarization process P2 (e.g., CMP) is performed to remove the excessive dielectric material 154, channel layer 152, and memory layer 150 above the front-side surface 116f of the multi-layered stack 116. As a result of this method, the channel layer 152 wraps around the dielectric material 154 in the through opening O1, the memory layer 150 wraps around the channel layer 152 in the through opening O1.

Figure 8:
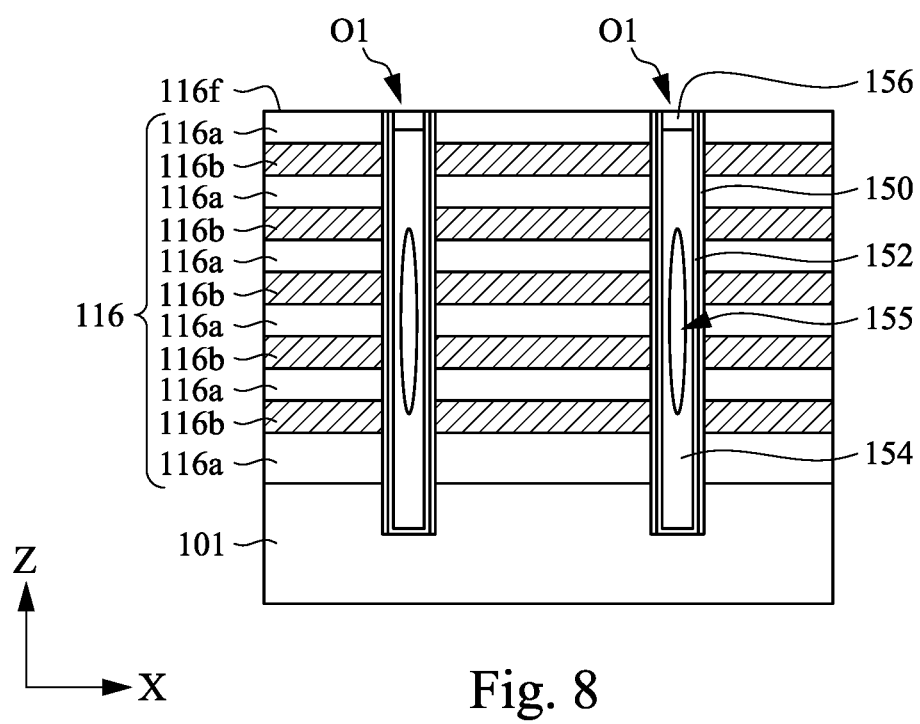

Referring back to FIG. 2A, the method M then proceeds to block S107 where a first bonding pad is formed on the first dielectric material and in contact with the first channel layer. With reference to FIG. 8, in some embodiments of block S107, an etching back process is performed on the dielectric material 154 to reappear an upper portion of the through opening O1. In some embodiments, the etching back process may be a dry etching process. For example, the dry etching process may be performed using $HF/NH_3$ or $NF_3/NH_3$ as the etching gas. Subsequently, a bonding pad 156 is formed in the upper portion of the through opening O1 and on the etched back dielectric material 154 to form an electrical contact with the channel layer 152. In some embodiments, the bonding pad 156 are formed by depositing a poly-silicon (Si), Ge, normally, n-type dopants ($N^+$), such as phosphorus or arsenic over the multi-layered stack 116. Subsequently, a planarization process is performed to remove the excessive semiconductor material above the front-side surface 116f of the multi-layered stack 116. As a result of this method, the bonding pad 156 can be formed as shown in FIG. 8. In some embodiments, the bonding pad 156 can be a $N^+$ poly-silicon pad.

Figure 9:
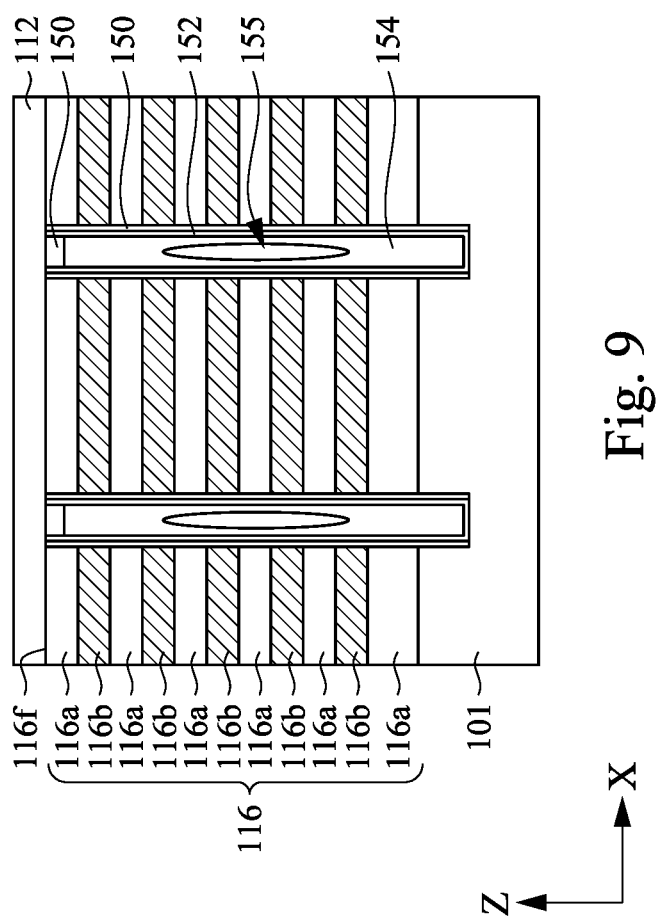

Referring back to FIG. 2A, the method M then proceeds to block S108 where at least one semiconductor layer is formed over the first multi-layered stack 116. With reference to FIG. 9, in some embodiments of block S108, the semiconductor layer 112 is formed over the multi-layered stack 116. In some embodiments, the semiconductor layer 112 can be made are formed by depositing polysilicon and can be interchangeably referred to as a polysilicon layer. In some embodiments, the semiconductor layer 112 can be highly doped, such as n-type dopants ($N^+$) including phosphorus or arsenic. In some embodiments, the semiconductor layer 112 can be made of a semiconductor material, such as polysilicon, Ge, SiGe, GaAs, the like, other suitable semiconductor materials, or combinations thereof. In some embodiments, the semiconductor layer 112 can be interchangeably referred to a common semiconductor layer or a common source line. Please change lay 112 to a semiconductor material.

Figure 10:
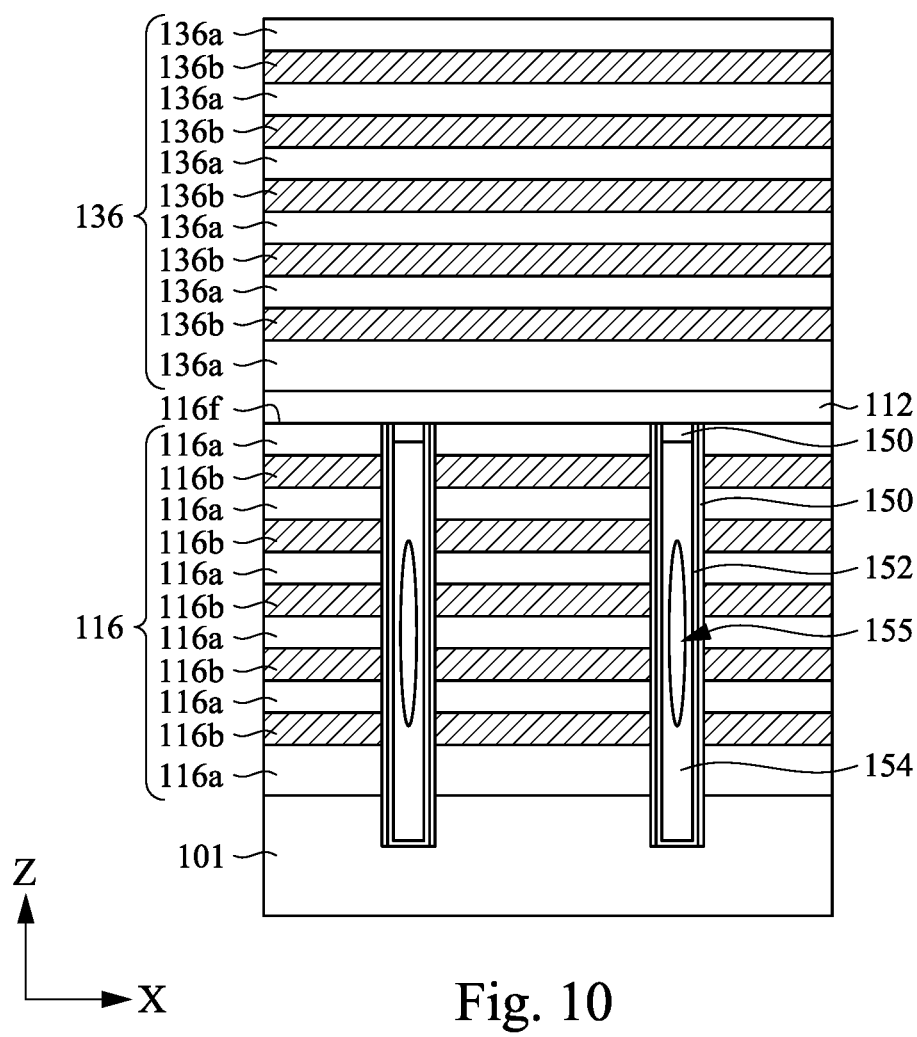

Referring back to FIG. 2A, the method M then proceeds to block S109 where a second multi-layered stack 136 including alternating second insulating layers and second sacrificial layers is formed on the semiconductor. With reference to FIG. 10, in some embodiments of block S109, a multi-layered stack 136 including alternating insulating layers 136a and sacrificial layers 136b is formed on the semiconductor layer 112. That is, the semiconductor layer 112 is sandwiched between the multi-layered stack 116 and the multi-layered stack 136. The insulating layers 136a and the sacrificial layers 136b are parallel to each other and alternatively stacked on the semiconductor layer 112 along Z-direction. In some embodiments, the multi-layered stack 136 can be interchangeably referred to a film stack or a deck of ON pairs. However, it should be appreciated that, in the embodiments of the present disclosure, the sacrificing layers 136b and the insulating layers 136a are made of different material. For example, the sacrificial layers 136b may be made of silicon nitride, and the insulating layers 136a may be made of silicon oxide. In some embodiments, the sacrificial layers 136b and the insulating layers 136a can be formed by low pressure chemical vapor deposition (LPCVD) process.

Figure 11:
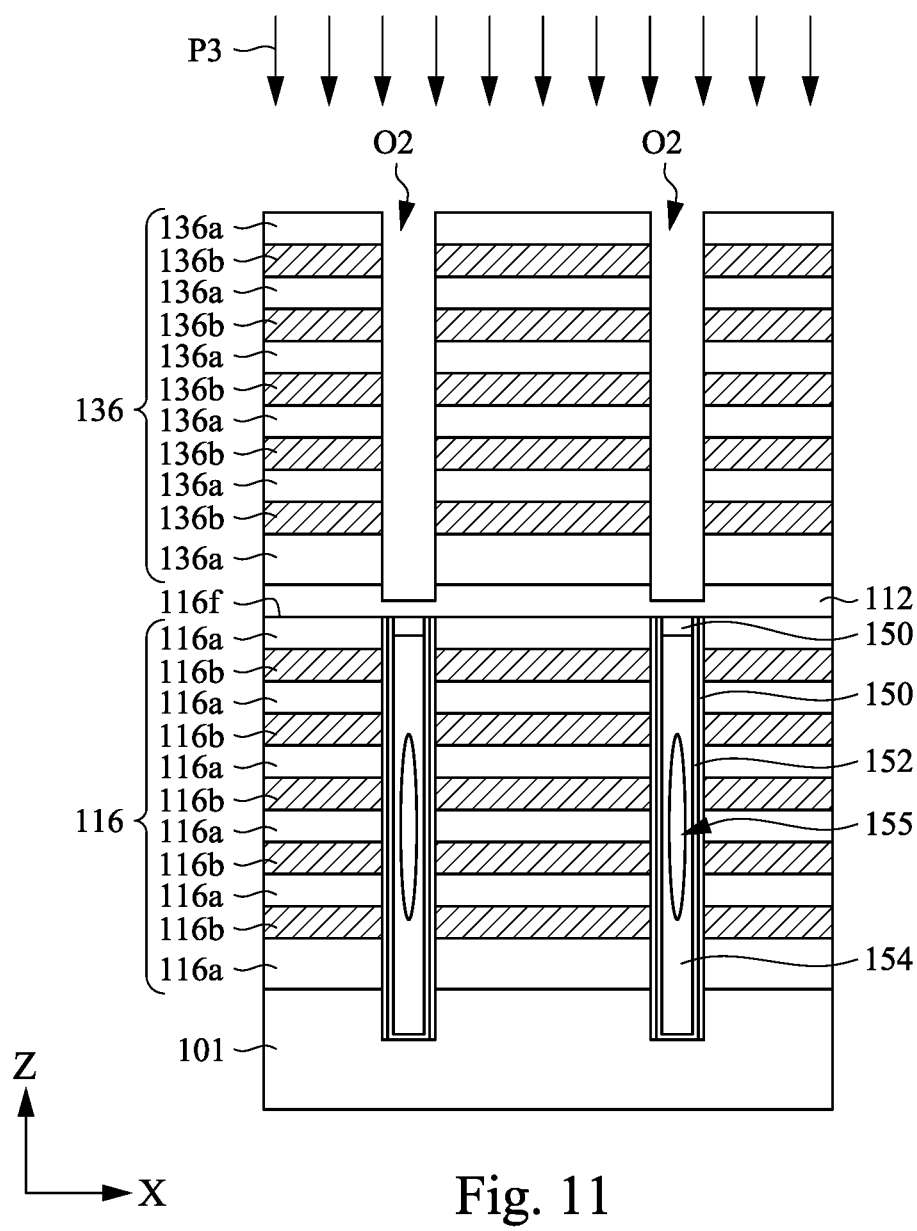

Referring back to FIG. 2A, the method M then proceeds to block S110 where a second etching process is performed to form a second through opening passing through the second multi-layered stack 136 and exposing the semiconductor layer. With reference to FIG. 11, in some embodiments of block S110, an etching process P3, such as a hole etch process, is performed on the multi-layered stack 136 to form a plurality of through openings O2 passing through the multi-layered stack 136 and exposing the semiconductor layer 112. In some embodiments, the etching process P3 can be an anisotropic etching process, such as a reactive ion etching (RIE) process, performed on the multi-layered stack 136 using a patterned hard mask layer as an etching mask formed on the multi-layered stack 136. In some embodiments, the through openings O2 may be a plurality of circular through holes passing through the multi-layered stack 136 along Z-direction and terminate at the semiconductor layer 112. The through opening O2 expose portions of the sacrificial layers 136b and the insulating layers 136a serving as the sidewall thereof. In some embodiments, the through opening O2 can be interchangeably referred to as a vertical channel opening. In some embodiments, the through opening O2 of the multi-layered stack 136 may overlap the underlying through opening O1 (see FIG. 4) of the multi-layered stack 116. In some embodiments, the through opening O2 of the multi-layered stack 136 may non-overlap the underlying through opening O1 (see FIG. 4) of the multi-layered stack 116.

Figure 12:
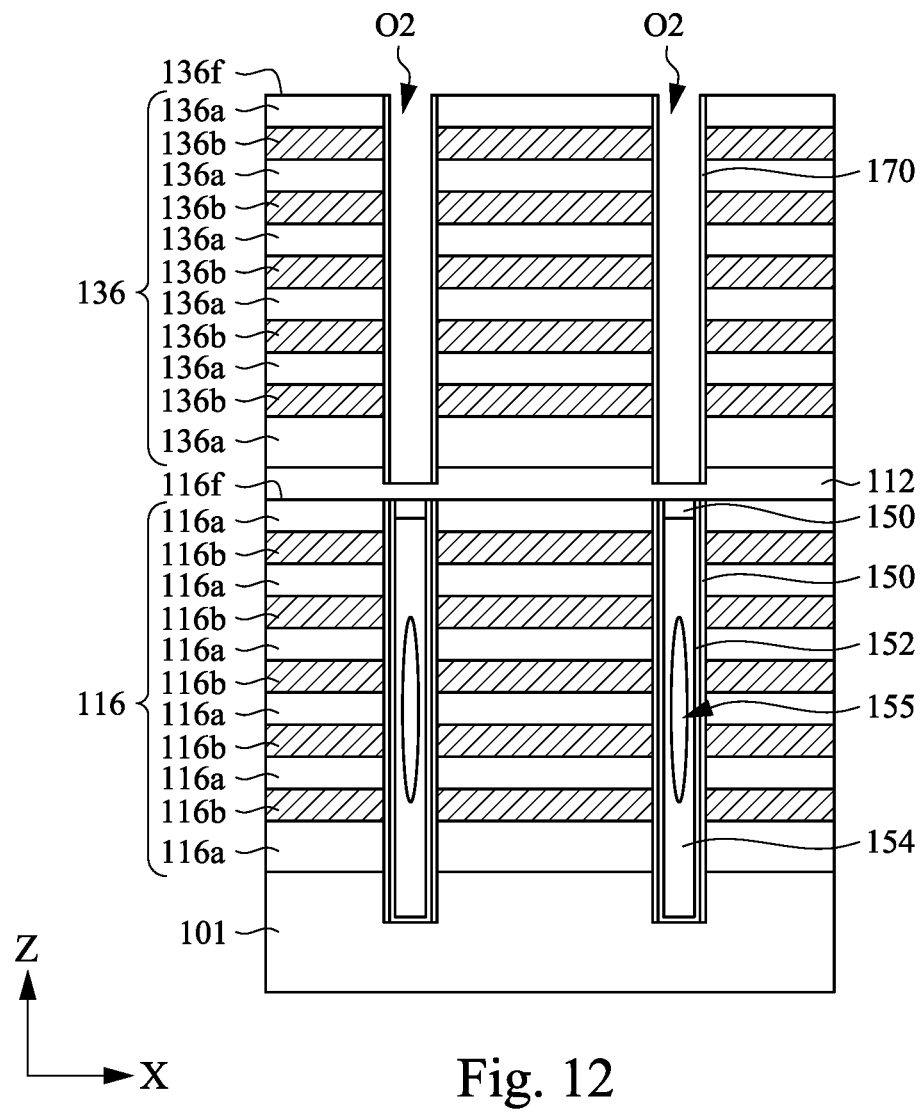

Referring back to FIG. 2B, the method M then proceeds to block S111 where a second memory layer is formed on the sidewall of the second through opening. With reference to FIG. 12, in some embodiments of block S111, a memory layer 170 is conformally deposited over the multi-layered stack 136 and on the sidewall and bottom of the through opening O2. In some embodiments, the memory layer 170 may include a composite layer having (but not limited to) oxide-nitride-oxide (ONO), oxide-nitride-oxide-nitride-oxide (ONONO) or oxide-nitride-oxide-nitride-oxide-nitride-oxide (ONONONO) structure formed to conformally blanket over the multi-layered stack 136 and the sidewall and bottoms of the through opening O2. Subsequently, an etching process is performed to remove portions of the composite layer disposed on the front-side surface 136f of the multi-layered stack 136 and on the bottom of the through opening O2 to form the memory layer 170.

Figure 13:
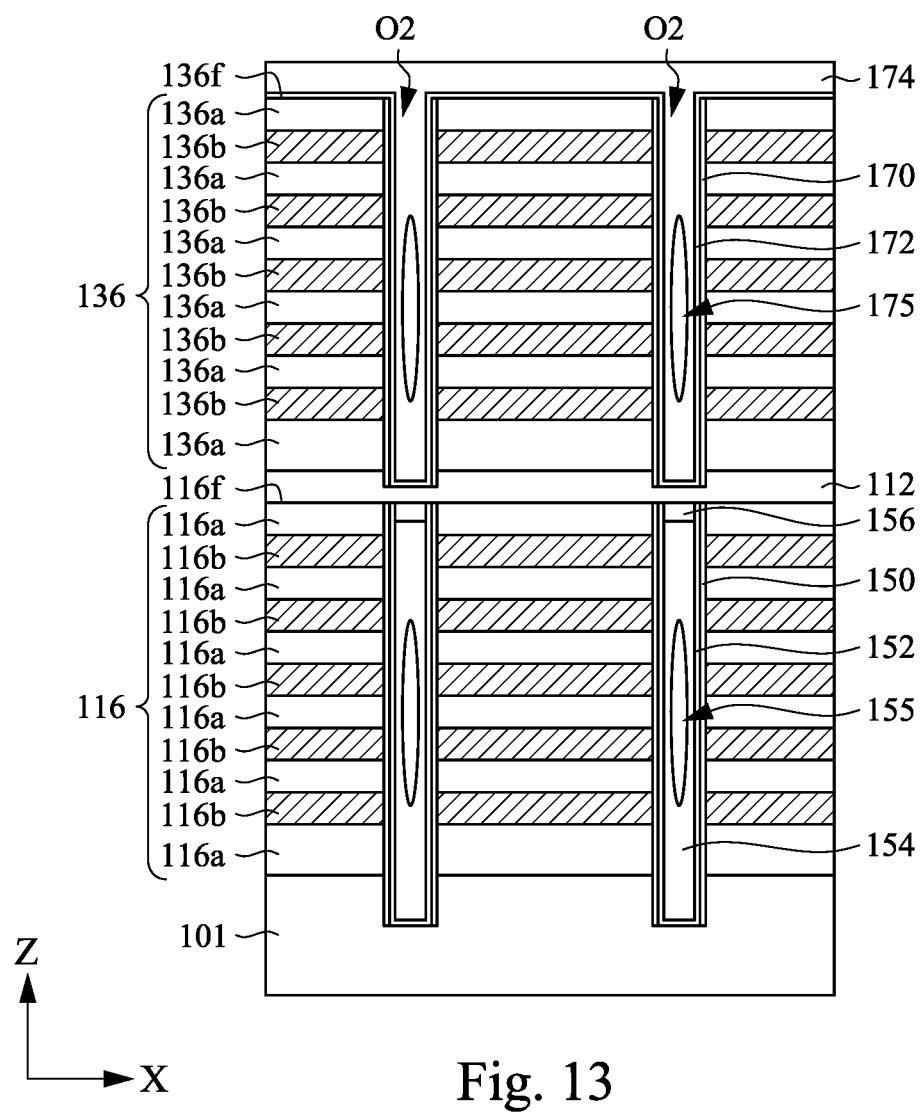

Referring back to FIG. 2B, the method M then proceeds to block S112 where a second channel layer is conformally formed over the second memory layer. With reference to FIG. 13, in some embodiments of block S112, a channel layer 172 is conformally deposited over the memory layer 170 and has an U-shaped cross-sectional profile, and thus the IC structure may include a vertical channel flash memory device. The memory layer 170 is disposed between the channel layer 172 and the sacrificial layers 136b. In some embodiments, the memory layer 170 may be made of semiconductor material, such as such as poly-silicon (Si), Ge or other doped/undoped semiconductor material. For example, the channel layer 172 may be made of doped poly-silicon.

Referring back to FIG. 2B, the method M then proceeds to block S113 where a second dielectric material is deposited over the second channel layer and fills in the second through opening. With reference to FIG. 13, in some embodiments of block S113, a dielectric material 174 is deposited over the channel layer 172 and fills in the through opening O2. In some embodiments, the dielectric material 174 may be made of, such as silicon dioxide ($SiO_2$). In some embodiments, at least one air gap 175 may be formed in the filled through opening O2. In some embodiments, the dielectric material 174 may be made of a same material as the insulating layers 136a. In some embodiments, the dielectric material 174 may be made of a different material than the insulating layers 136a.

Figure 14:
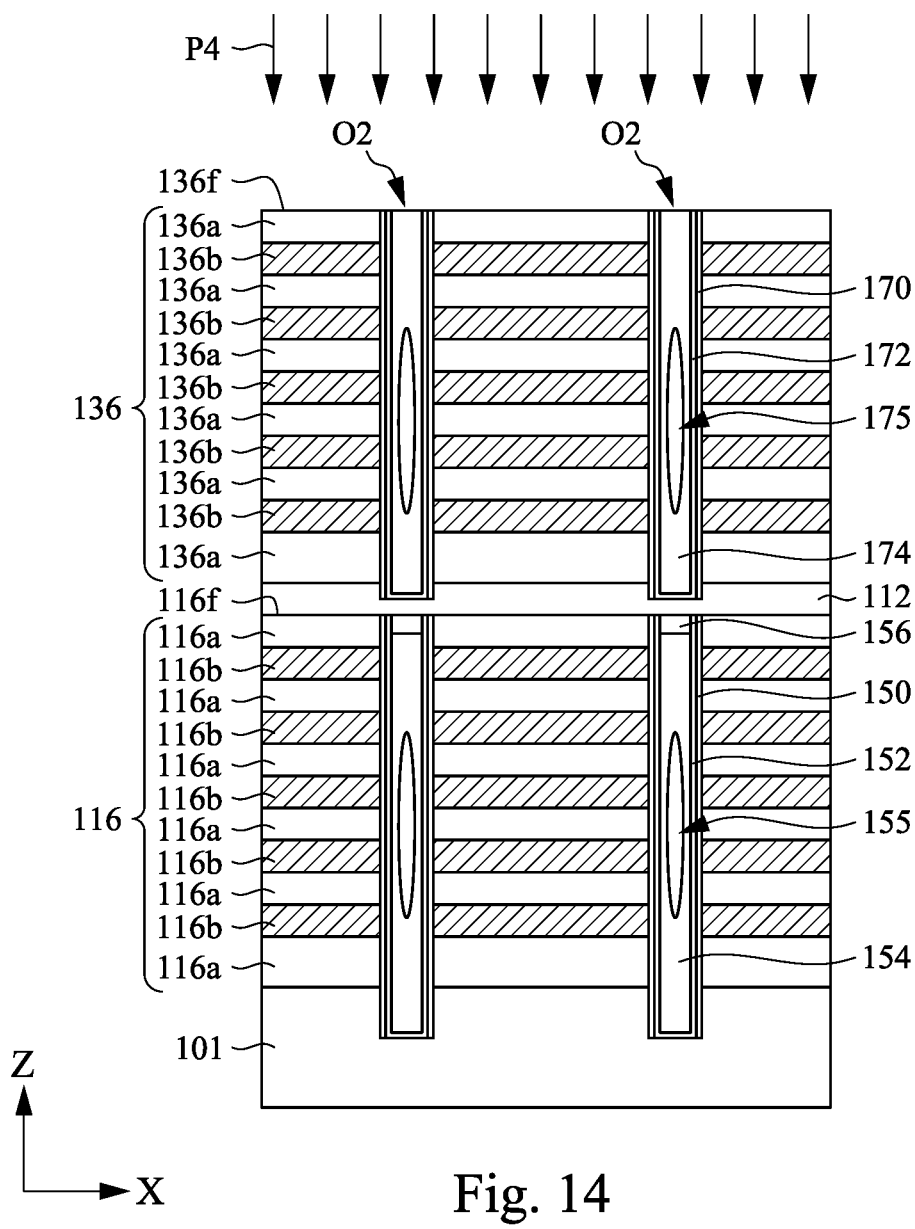

Referring back to FIG. 2B, the method M then proceeds to block S114 where a second planarization process is performed to remove the excessive second dielectric material, second channel layer, and second memory layer above a top surface of the second multi-layered stack 136. With reference to FIG. 14, in some embodiments of block S114, a planarization process P4 (e.g., CMP) is performed to remove the excessive dielectric material 174, channel layer 172, and memory layer 170 above the front-side surface 136f of the multi-layered stack 136. As a result of this method, the channel layer 172 wraps around the dielectric material 174 in the through opening O2, the memory layer 170 wraps around the channel layer 172 in the through opening O2.

Figure 15:
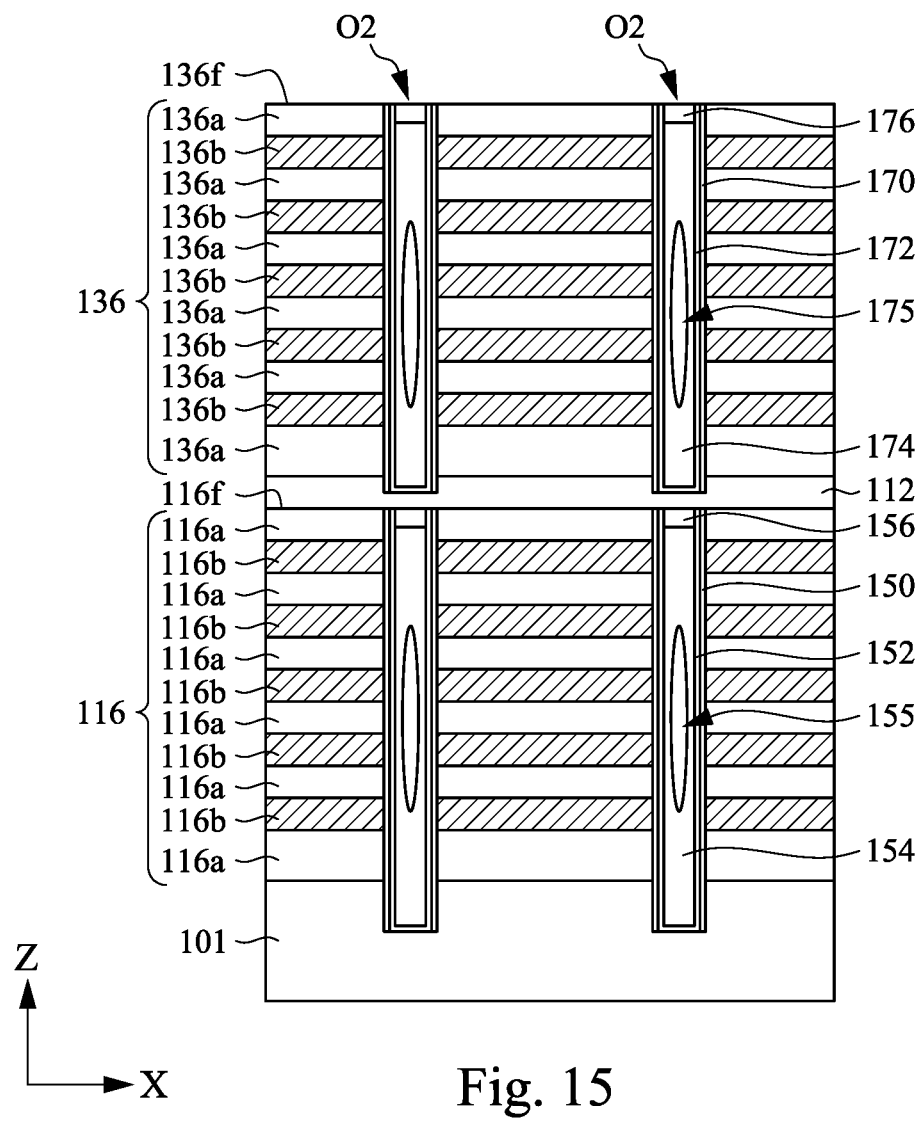

Referring back to FIG. 2B, the method M then proceeds to block S115 where a second bonding pad is formed on the second dielectric material and in contact with the second channel layer. With reference to FIG. 15, in some embodiments of block S115, an etching back process is performed on the dielectric material 174 to reappear an upper portion of the through opening O2. In some embodiments, the etching back process may be a dry etching process. For example, the dry etching process may be performed using $HF/NH_3$ or $NF_3/NH_3$ as the etching gas. Subsequently, a bonding pad 176 is formed in the upper portion of the through opening O2 and on the etched back dielectric material 174 to form an electrical contact with the channel layer 172. In some embodiments, the bonding pad 176 are formed by depositing a poly-silicon (Si), Ge, normally, n-type dopants ($N^+$), such as phosphorus or arsenic over the multi-layered stack 136. Subsequently, a planarization process is performed to remove the excessive semiconductor material above the front-side surface 136f of the multi-layered stack 136. As a result of this method, the bonding pad 176 can be formed as shown in FIG. 15. In some embodiments, the bonding pad 176 can be a $P^+$ poly-silicon pad.

Figure 16:
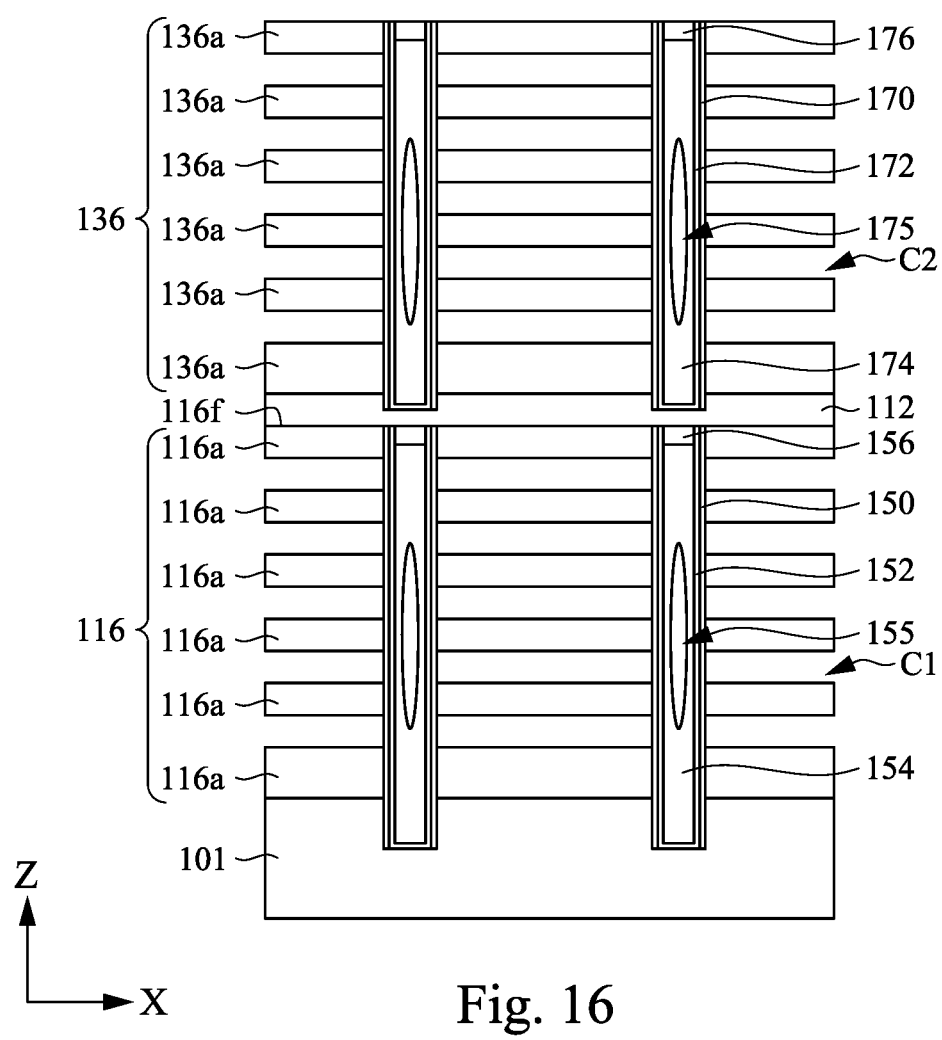

Referring back to FIG. 2B, the method M then proceeds to block S116 where the first and second sacrificial layers of the first and second multi-layered stacks 116 and 136 are removed. With reference to FIG. 16, in some embodiments of block S116, an etching process is performed to form a through opening (not shown) passing through the first and second multi-layered stacks 116 and 136 along the Z-direction and terminating at the substrate 101, so as to partially expose sidewalls of the sacrificing layers 116b and 136b (see FIG. 15) and the insulating layers 116a and 136a. In some embodiments, the etching process can be an anisotropic etching process, such as a reactive ion etching (RIE) process, performed on the first and second multi-layered stacks 116 and 136 using a patterned hard mask layer (not shown) as an etching mask formed on the multi-layered stack 136. Subsequently, the sacrificial layers 116b and 136b (see FIG. 15) are removed by a solution, such as using phosphoric acid ($H_3PO_4$) solution, through the through opening (not shown) to expose portions of the memory layers 150 and 170. Therefore, spaces C1 are formed to inherit the shapes of the sacrificial layers 116b, and spaces C2 are formed to inherit the shapes of the sacrificial layers 136b.

Figure 17:
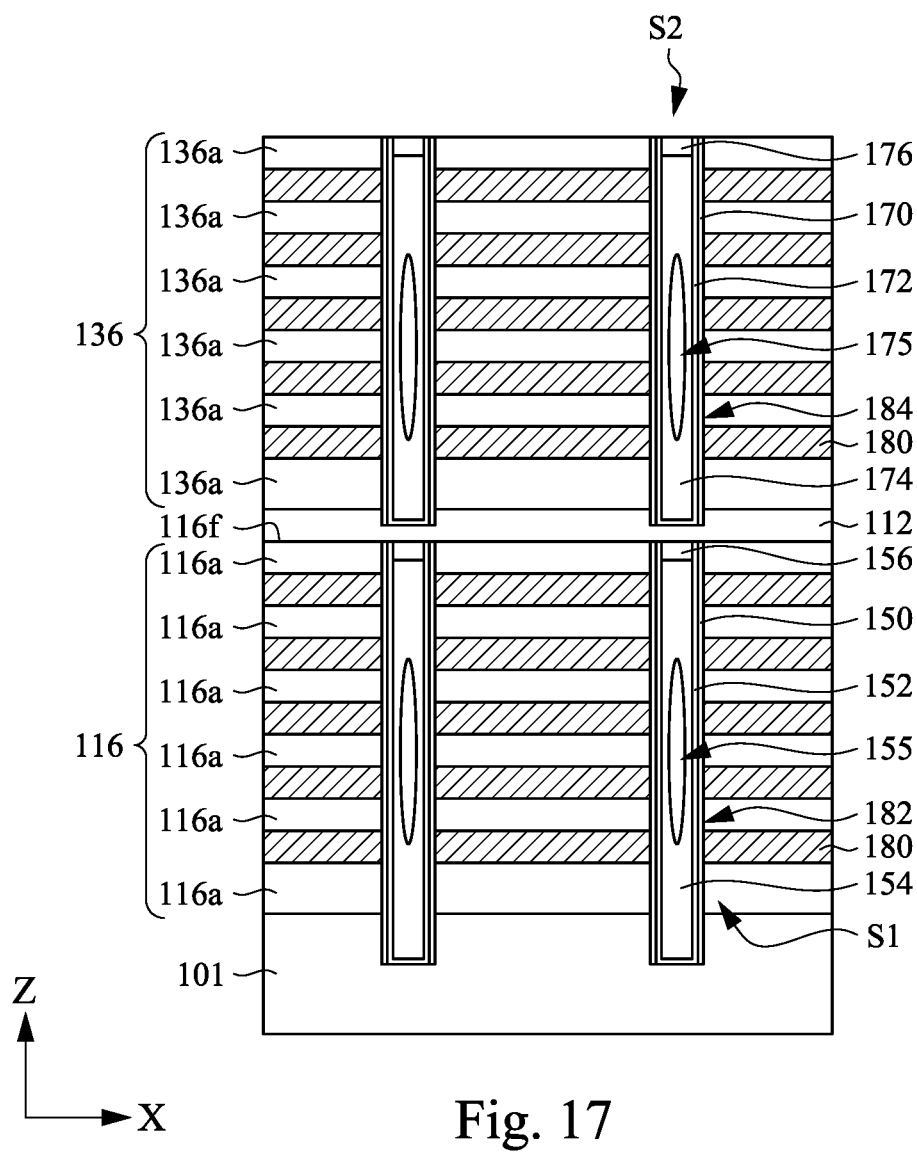

Referring back to FIG. 2B, the method M then proceeds to block S117 where a plurality of gate layers are formed in spaces where the first and second sacrificing layers initially occupied so as to form first memory cells with the first memory layers and the first channel layers, and second memory cells with the second memory layer and the second channel layers. With reference to FIG. 17, in some embodiments of block S117, a plurality of gate layers 180 are formed in the spaces C1 and C2 (see FIG. 16) through the through opening (not shown) descripted in FIG. 16. As a result, a plurality of memory cells 182 can be defined at the points of intersection between the gate layers 180, the memory layers 150, and the channel layers 152, and a plurality of memory cells 184 can be defined at the points of intersection between the gate layers 180, the memory layers 170, and the channel layers 172, so as to form a memory cell array in the first and second multi-layered stacks 116 and 136, such that a 3D NAND architecture can be formed. The semiconductor layer 112 is between the memory cells 182 and 184 and electrically connected to the memory cells 182 and 184.

In some embodiments, the memory cells 182 in the same column can be referred to as a subsidiary memory string S1, the memory cells 184 in the same column can be referred to as a subsidiary memory string S2, and the subsidiary memory strings S1 and S2 can be collectively referred to as a memory string. That is, the source line (i.e., semiconductor layer 112) is formed in the middle of the memory string, which in turn reduces the string length, such that the current in the NAND can be increased. For example, if the string length is halved, the current in the NAND can be doubled. In other words, if the number of strings (e.g., subsidiary memory strings S1 and S2) in the same column of the NAND array is divided into n, the current can become n times the original.

In NAND flash memory, a memory string (e.g., memory string S1/S2) is a series of connected memory cells (e.g., memory cell 182/184) in the NAND memory array. NAND flash memory is organized into blocks, pages, and strings. Each block contains multiple pages, and each page consists of multiple memory strings. Within a memory string, memory cells are connected in series and are controlled by a single select gate transistor (e.g., gate layer 180). To access a specific memory cell within a memory string, a series of voltages is applied to the control gates and select gate transistor of each memory cell in the string. This allows the data stored in the cell to be read or written. Memory strings are used in NAND flash memory arrays because they allow for a high density of memory cells within a small area of the chip.

In some embodiments, the gate layers 180 may include poly-silicon, metal or other suitable conductive material. In some embodiments, the gate layers 180 may include metal layers, such as TiN/W, TaN/W, TaN/Mo, or the like. In some embodiments, the gate layers 180 may include dielectric layer, such as $AlO_x$. For example, each of the gate layers 180 can be a multi-layered structure including a high-K material layer (e.g., $HfO_x$ layer or $AlO_x$ layer), a TiN layer, and a tungsten layer.

Figure 18:
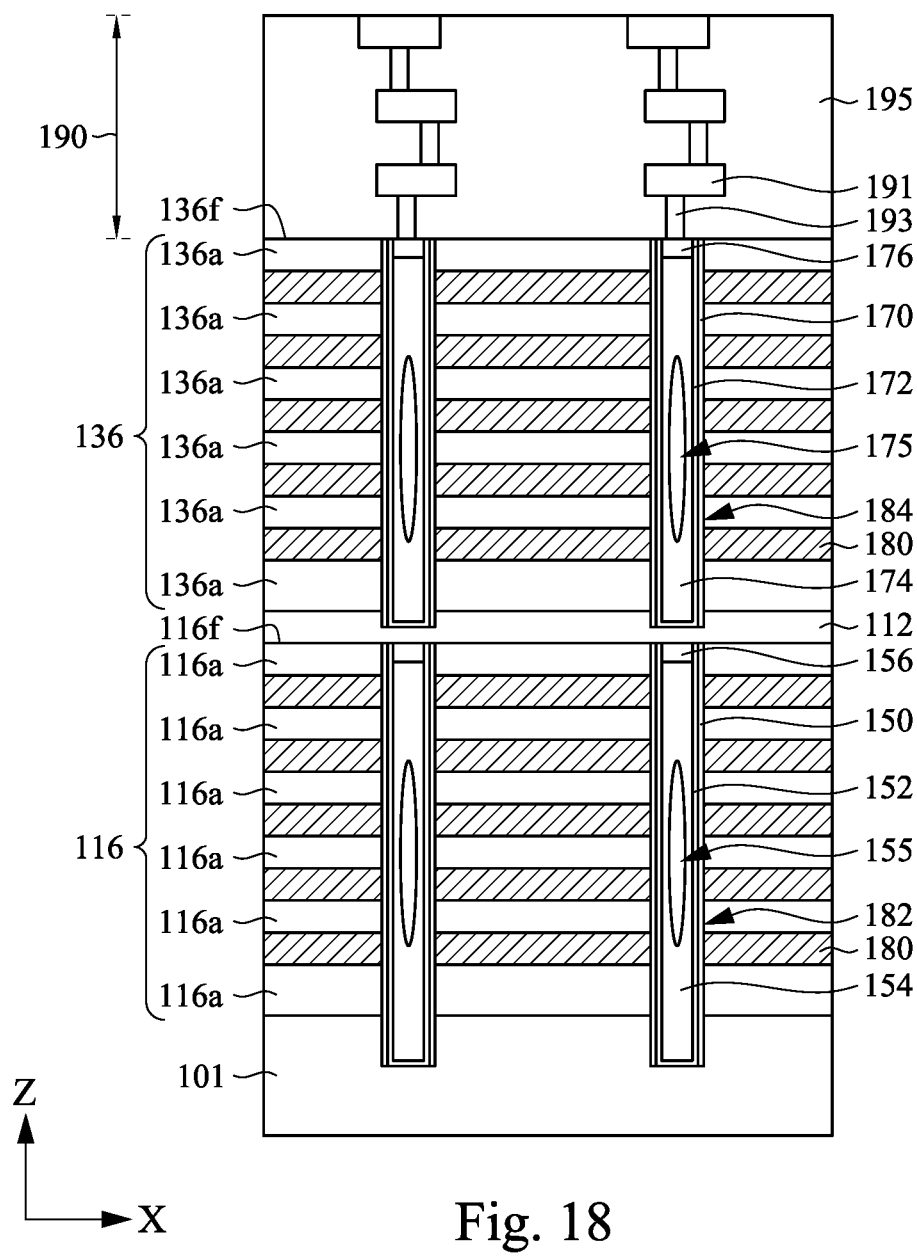

Referring back to FIG. 2B, the method M then proceeds to block S118 where a first interconnect structure is formed over a front-side surface of the second multi-layered stack 136 and electrically connected to the first and second memory cells. With reference to FIG. 18, in some embodiments of block S118, an interconnect structure 190 is formed over the front-side surface 136f of the multi-layered stack 136. In some embodiments, the interconnect structure 190 may include, for example, three metallization layers 191, with three layers of metallization vias 193. Other embodiments may contain more or fewer metallization layers and corresponding more or fewer number of vias. In some embodiments, the metallization layer 191 can interchangeably referred to a bottom bit line (BL).

Figure 19:
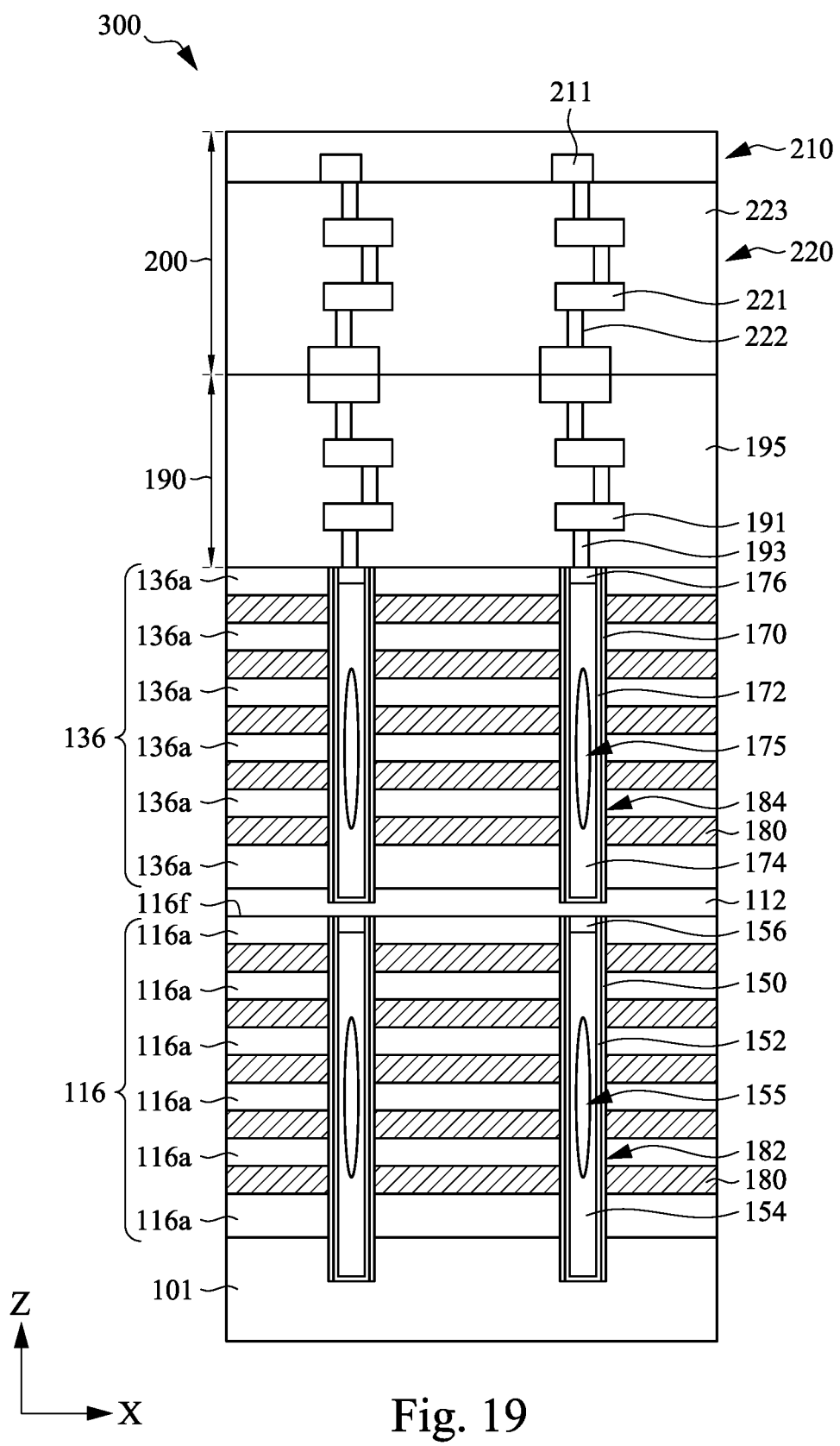

In some embodiments, the metallization layers 191 and metallization vias 193 may be made of TIN, TaN, Ti, Ta, Cu, Al, Ag, W, Ir, Ru, Pt, combinations thereof, or other suitable conductive materials. Also included in the interconnect structure 190 is a plurality of inter-metal dielectric (IMD) layers. In some embodiments, the plurality of IMD layers can be collectively referred to as an IMD structure 195. The IMD structure 195 may provide electrical insulation as well as structural support for the various features of the integrated circuit during many fabrication process steps. In some embodiments, the topmost metal layer in the interconnect structure 190 can be interchangeably referred to a bonding layer. For example, the topmost metal layer in the interconnect structure 190 can be a Cu layer for Cu to Cu bonding in a subsequent process as shown in FIG. 19. In some embodiments, the interconnect structure 190 can be formed in accordance with a back end of line (BEOL) scheme.

Referring back to FIG. 2B, the method M then proceeds to block S119 where an integrated circuit (IC) structure including a semiconductor device is bonded to the first interconnect structure to form a stacked wafer structure. With reference to FIG. 19, in some embodiments of block S119, an IC structure 200 (e.g., CMOS wafer) is provided. The IC structure 200 includes a semiconductor substrate 210 and an interconnect structure 220 formed on the semiconductor substrate 210. In some embodiments, the semiconductor substrate 210 may include complementary metal-oxide-semiconductor (CMOS) devices 211 therein. In some embodiments, the interconnect structure 220 may include, for example, three metallization layers 221, with three layers of metallization vias 222. Other embodiments may contain more or fewer metallization layers and corresponding more or fewer number of vias. In some embodiments, the metallization layers 221 and metallization vias 222 may be made of TIN, TaN, Ti, Ta, Cu, Al, Ag, W, Ir, Ru, Pt, combinations thereof, or other suitable conductive materials. Also included in the interconnect structure 220 is a plurality of inter-metal dielectric (IMD) layers. In some embodiments, the plurality of IMD layers can be collectively referred to as an IMD structure 223. The IMD structure 223 may provide electrical insulation as well as structural support for the various features of the integrated circuit during many fabrication process steps.

Subsequently, the interconnect structure 190 having memory cells 182 and 184 (e.g. 3D NAND) thereon is bonded to the interconnect structure 220 to electrically connect to the CMOS devices 211 and from a stacked wafer structure 300. Therefore, before the bonding, the CMOS devices 211 are not impacted by higher thermal budgets of memory process steps. The CMOS devices 211 can be formed by an advanced process to provide higher speed and lower current operation, and to have a smaller chip area. Specifically, the IC structure 200 is bonded to an outermost metal layer in the interconnect structure 190 through an outermost metal layer (e.g., bonding layer) thereof in the interconnect structure 220. In some embodiments, a combination of the interconnect structures 190 and 220 can be referred to as an interconnect stack.

Figure 20:
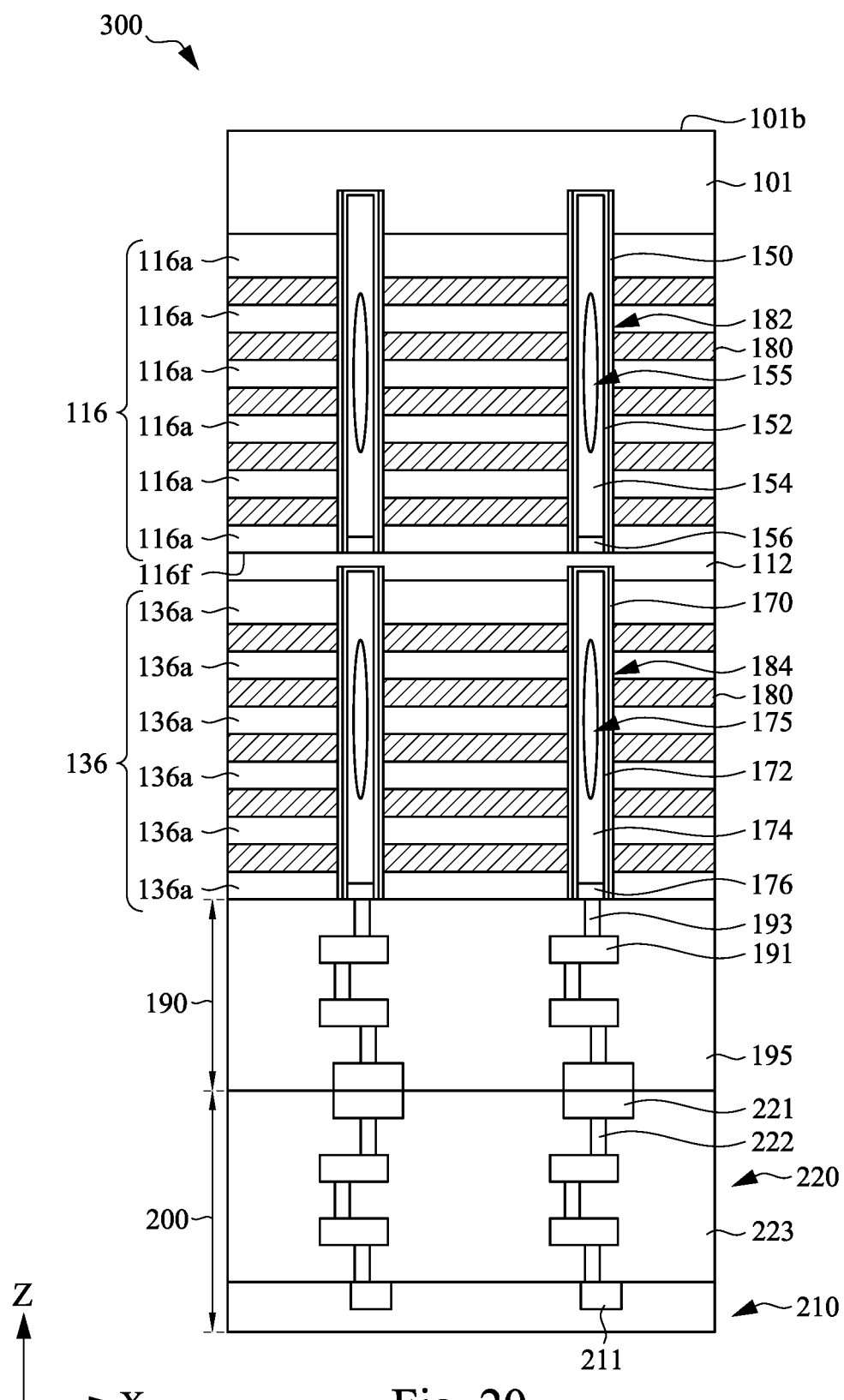

Referring back to FIG. 2B, the method M then proceeds to block S120 where the stacked wafer structure is flipped upside down. With reference to FIG. 20, in some embodiments of block S120, the stacked wafer structure 300 is flipped upside down. After the flipping, a back-side surface 101b of the substrate 101 faces upwardly and the memory cells 182 and 184 are carried by the IC structure 200 for subsequent processes. In some embodiments, the flipping process may be optional.

Figure 21:
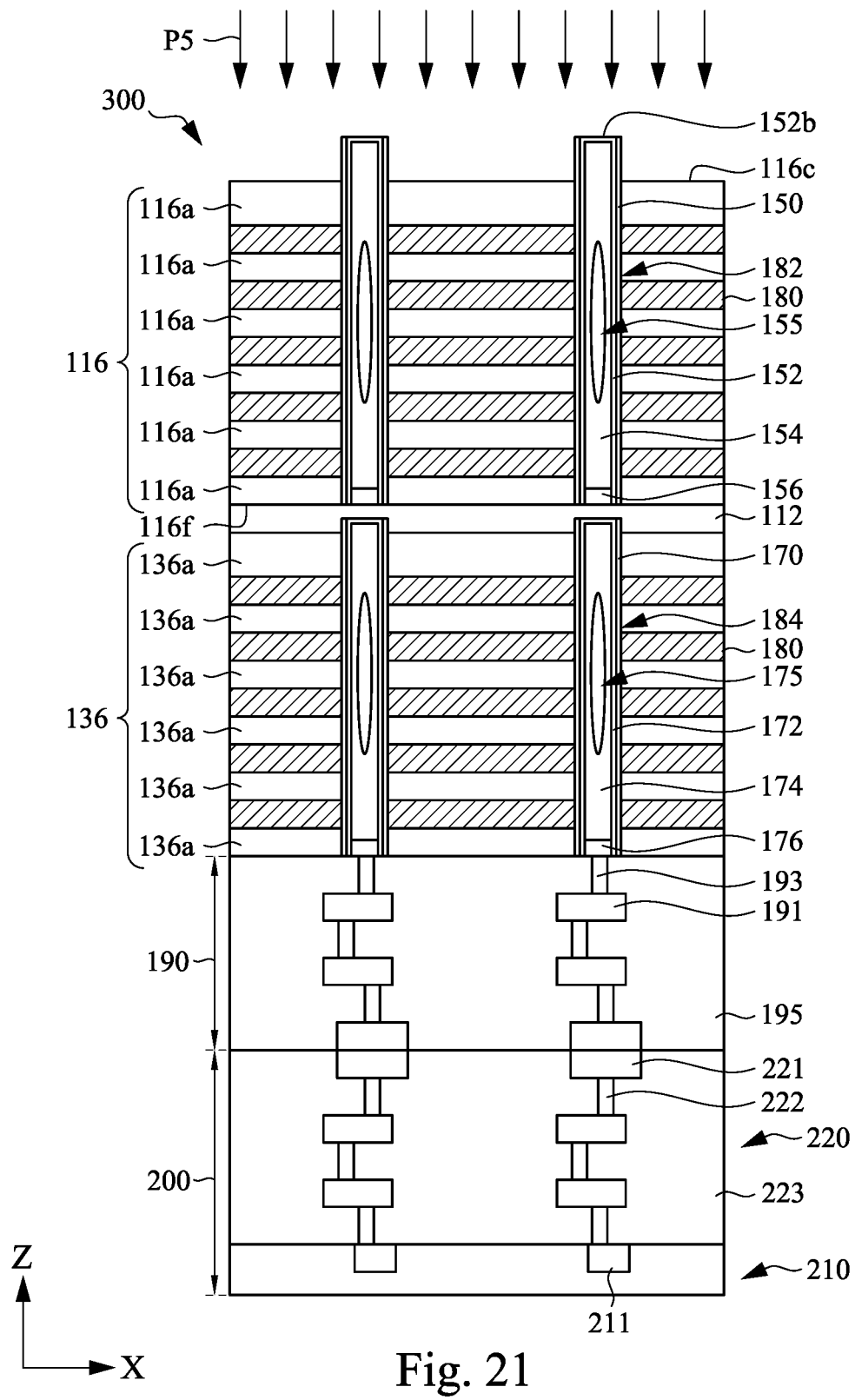

Referring back to FIG. 2C, the method M then proceeds to block S121 where the substrate is removed, such that the first channel layer of the first memory cell is exposed from a back-side of the first multi-layered stack 116. With reference to FIG. 21, in some embodiments of block S121, an etching process P5 including a silicon etching process and a planarization process (e.g., CMP) is performed on the back-side surface 101b of the substrate 101 (see FIG. 20) and terminates at the outermost insulating layer 116a in the multi-layered stack 116. The resulting structure is illustrated in FIG. 21, and the channel layer 152 is exposed from a back-side surface 116c of the multi-layered stack 116. In some embodiments, the channel layer 152 has a back-side surface 152b protruding from the back-side surface 116c of the multi-layered stack 116.

Figure 22:
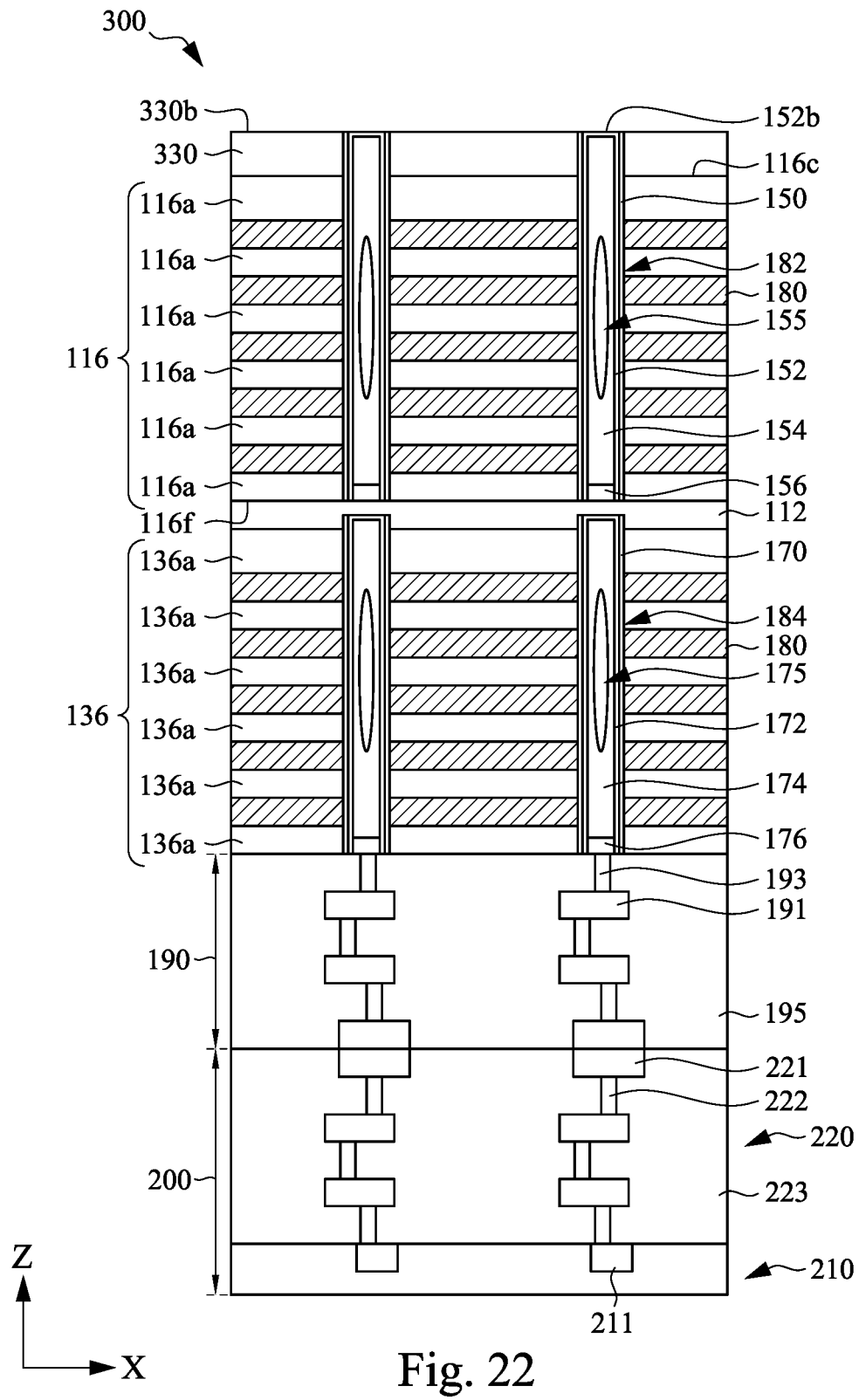

Referring back to FIG. 2C, the method M then proceeds to block S122 where a dielectric layer is formed over the back-side of the first multi-layered stack 116 and laterally surrounds an end portion of the first channel layer. With reference to FIG. 22, in some embodiments of block S122, a dielectric layer 330 is deposited over the back-side surface 116c of the first multi-layered stack 116. In some embodiments, the dielectric layer 330 may be made of, such as silicon dioxide (SiO$_2$). In some embodiments, the dielectric layer 330 may be made of a same material as the insulating layers 116a and/or the insulating layers 136a. In some embodiments, the dielectric layer 330 may be made of a different material than the insulating layers 116a and/or the insulating layers 136a.

Subsequently, a planarization process is performed to remove the excessive dielectric layer 330 above the channel layer 152 until the channel layer 152 is exposed, such that the dielectric layer 330 can laterally surround an end portion of the channel layer 152, and a back-side surface 330b of the dielectric layer 330 can be in a position level with the back-side surface 152b of the channel layer 152.

Figure 23:
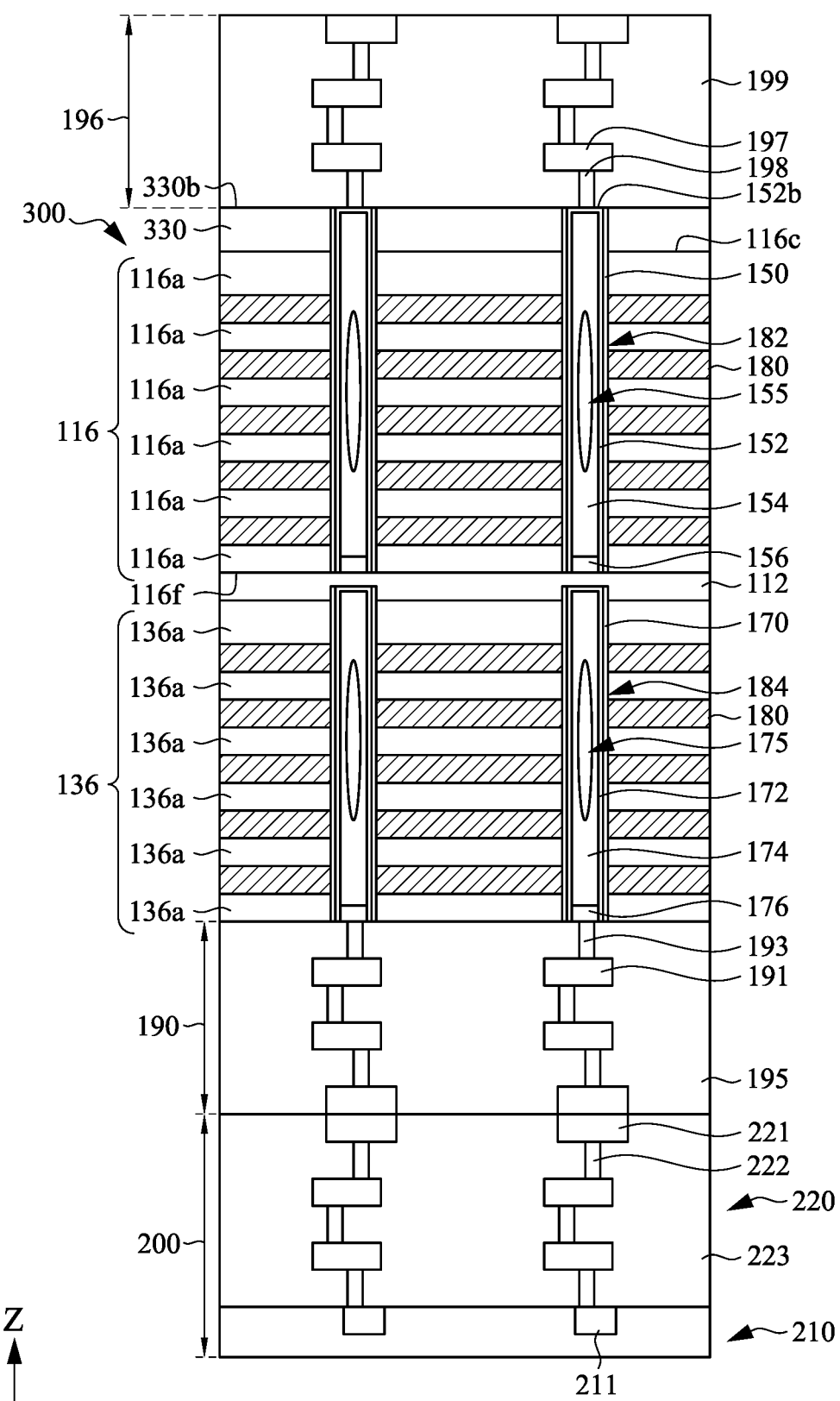

Referring back to FIG. 2C, the method M then proceeds to block S123 where a second interconnect structure is formed over the back-side of the first multi-layered stack 116 and electrically connected to the first channel layer of the first memory cell. With reference to FIG. 23, in some embodiments of block S123, an interconnect structure 196 is formed over the back-side surface 116c of the multi-layered stack 116 and electrically connected to the channel layer 152 of the memory cell 182. In some embodiments, the interconnect structure 196 may include, for example, three metallization layers 197, with three layers of metallization vias 198. Other embodiments may contain more or fewer metallization layers and corresponding more or fewer number of vias. In some embodiments, the metallization layer 197 can interchangeably referred to a top bit line (BL).

In addition, once the memory array is formed, the top bit line, the bottom bit line, and the CMOS wafer can be bonded to the bottom and/or the top of the memory array. Therefore, before the bonding, the 3D NAND can be formed in a high thermal budget process without impacting the top bit line, the bottom bit line, and the CMOS wafer, which in turn allows for improving the performance of the IC structure.

In some embodiments, the metallization layers 197 and metallization vias 198 may be made of TiN, TaN, Ti, Ta, Cu, Al, Ag, W, Ir, Ru, Pt, combinations thereof, or other suitable conductive materials. Also included in the interconnect structure 196 is a plurality of inter-metal dielectric (IMD) layers. In some embodiments, the plurality of IMD layers can be collectively referred to as an IMD structure 199. The IMD structure 199 may provide electrical insulation as well as structural support for the various features of the integrated circuit during many fabrication process steps. In some embodiments, the topmost metal layer in the interconnect structure 196 can be interchangeably referred to a bonding layer. In some embodiments, the interconnect structure 196 can be formed in accordance with a back end of line (BEOL) scheme.

Referring back to FIG. 2C, the method M then proceeds to block S124 where a third interconnect structure including a deep via is formed over the second interconnect structure to electrically connect the first and second memory cells to the semiconductor device in the IC structure. With reference to FIG. 24A, in some embodiments of block S124, an interconnect structure 340 is formed over the interconnect structure 196 and electrically connected to the interconnect structure 196. The interconnect structure 340 include a deep via 342. The deep via 342 is formed to extend from an outermost metallization layer 344 in the interconnect structure 340 through the interconnect structure 196, the multi-layered stacks 116 and 136, and the interconnect structure 190 to a metallization layer 191 in the interconnect structure 190, such that the deep via 342 can electrically connect the memory cells 182 and 184 to the semiconductor device 211 in the IC structure 200.

In some embodiments, the metallization layer 344 and/or the deep via 342 may be made of TIN, TaN, Ti, Ta, Cu, Al, Ag, W, Ir, Ru, Pt, combinations thereof, or other suitable conductive materials. In some embodiments, the deep via 342 may include one or more barrier/adhesion layers (not shown) surrounding thereof to protect the deep via 342 from metal diffusion (e.g., copper diffusion). The one or more barrier/adhesion layers may comprise titanium, titanium nitride, tantalum, tantalum nitride, or the like, and may be formed using physical vapor deposition (PVD), CVD, ALD, or the like. Also included in the interconnect structure 340 is a plurality of inter-metal dielectric (IMD) layers. In some embodiments, the plurality of IMD layers can be collectively referred to as an IMD structure 346. The IMD structure 346 may provide electrical insulation as well as structural support for the various features of the integrated circuit during many fabrication process steps. In some embodiments, the topmost metal layer in the interconnect structure 346 can be interchangeably referred to a bonding layer.

Figure 24B:
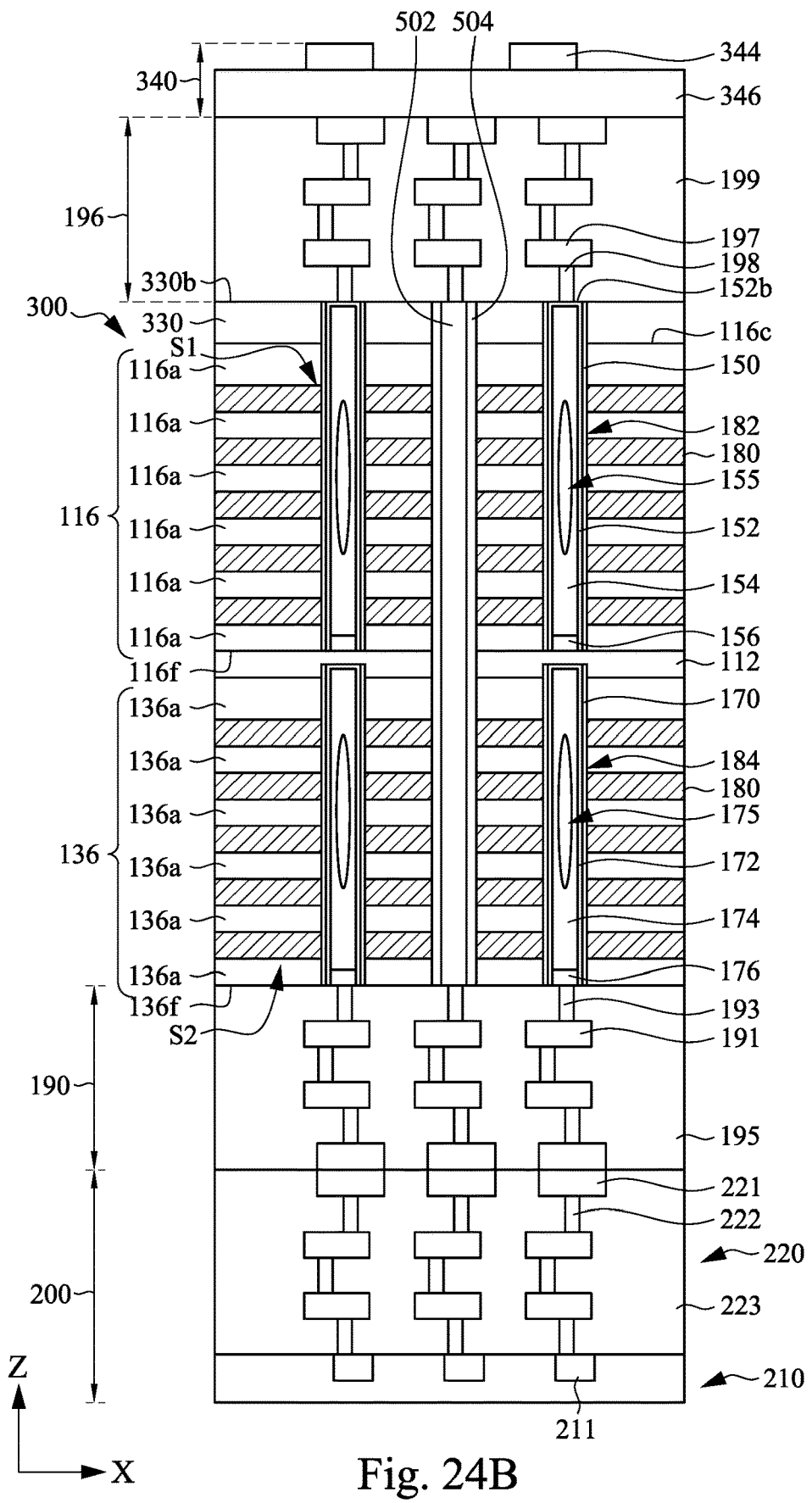

Reference is made to FIG. 24B. FIG. 24B illustrates another IC structure at a stage corresponding to FIG. 24A according to some alternative embodiments of the present disclosure. In some embodiments, material and manufacturing method of elements of the present embodiment are substantially the same as those of the elements as shown in FIG. 24A, and the related detailed descriptions may refer to the foregoing paragraphs, and are not described again herein. In addition, the present embodiment may repeat reference numerals and/or letters in the various examples. This repetition is for the purpose of simplicity and clarity and does not in itself dictate a relationship between the various embodiments and/or configurations discussed.

The difference between the present embodiment and the embodiment in FIG. 24A is that a metal plug 502 is formed to pass through the multi-layered stacks 116 and 136 and the common source line (i.e., semiconductor layer 112) and electrically connected the interconnect structure 196 to the semiconductor device 211 in the IC structure 200. A dielectric material 504 is formed to laterally surround the metal plug 502 to insulate the metal plug 502 from the gate layer 180. In some embodiments, the metal plug 502 may be made of TiN, TaN, Ti, Ta, Cu, Al, Ag, W, Ir, Ru, Pt, combinations thereof, or other suitable conductive materials. In some embodiments, the dielectric material 504 may be made of, such as silicon dioxide (SiO$_2$) or silicon nitride (SiN).

Although the present invention has been described in considerable detail with reference to certain embodiments thereof, other embodiments are possible. Therefore, the spirit and scope of the appended claims should not be limited to the description of the embodiments contained herein. The present disclosure in various embodiments provides a 3D NAND having a source line formed in the middle of the memory string, which in turn reduces the string length, such that the current in the NAND can be increased. For example, if the string length is halved, the current in the NAND can be doubled. In other words, if the number of strings in the same column of the NAND array is divided into n, the current can become n times the original. In addition, once the memory array is formed, the top bit line, the bottom bit line, and the CMOS wafer can be bonded to the bottom and/or the top of the memory array. Therefore, before the bonding, the 3D NAND can be formed in a high thermal budget process without impacting the top bit line, the bottom bit line, and the CMOS wafer, which in turn allows for improving the performance of the IC structure. Other the other hand, after forming of the 3D NAND, the top bit line and the bottom bit line can be formed by a back end of line (BEOL) process, which in turn improved the RC of the IC structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An integrated circuit (IC) structure, comprising:
   a substrate;
   a first memory string over the substrate and comprising first memory cells stacked in a vertical direction;
   a source line laterally extending over the first memory string;
   a second memory string over the source line and comprising second memory cells stacked in the vertical direction;
   a metal plug extending through and penetrating the source line, the metal plug being electrically connected to the first and second memory strings; and
   a dielectric material laterally surrounding the metal plug to insulate the metal plug from gate layers of the first and second memory strings.

2. The IC structure of claim 1, wherein the first memory string comprises a first channel layer extending in the vertical direction and having an innermost position in contact with a first surface of the source line.

3. The IC structure of claim 2, wherein the second memory string comprises a second channel layer vertically extending in the vertical direction and having an innermost position in contact with a second surface of the source line opposite to the first surface of the source line.

4. The IC structure of claim 3, wherein the second channel layer is spaced apart from the first channel layer by the source line.

5. The IC structure of claim 1, further comprising:
   a first bit line laterally extending between the substrate and the first memory string and electrically connected to the first memory string; and
   a second bit line laterally extending above the second memory string and electrically connected to the second memory string.

6. The IC structure of claim 5, wherein the first and second bit lines are made of a same material.

7. The IC structure of claim 5, wherein the first and second bit lines comprise copper.

8. The IC structure of claim 1, wherein the substrate comprises a complementary metal oxide semiconductor (CMOS) device.

9. The IC structure of claim 8, further comprising:
   a deep via vertically extending through the source line, and electrically connected the first and second memory strings to the CMOS device.

10. The IC structure of claim 8, wherein the metal plug is electrically connected the first and second memory strings to the CMOS device.

11. A method for forming an integrated circuit structure, comprising:
    forming a first multi-layered stack, the first multi-layered stack comprising first insulating layers stacked in a vertical direction and spaced apart from each other;
    forming a first memory layer vertically extending through the first multi-layered stack;
    forming a first channel layer on the first memory layer;
    forming a source line vertically extending over the first multi-layered stack;
    forming a second multi-layered stack over the source line, the second multi-layered stack comprising second insulating layers stacked in the vertical direction and spaced apart from each other;
    forming a second memory layer vertically extending through the second multi-layered stack;
    forming a second channel layer on the second memory layer;
    forming first gate layers alternately stacked with the first insulating layers to form a first memory string, and second gate layers alternately stacked with the second insulating layers to form a second memory string;
    after forming the first and second gate layers, forming a first interconnect structure over the second multi-layered stack from a side of the second multi-layered stack opposite to the source line, the first interconnect structure comprising a plurality of metallization layers and corresponding vias; and
    after forming the first interconnect structure, forming a second interconnect structure over the first multi-layered stack from a side of the first multi-layered stack opposite to the source line.

12. The method of claim 11, wherein forming the source line is performed after forming the first channel layer.

13. The method of claim 11, wherein the source line is made of doped polysilicon.

14. The method of claim 11, further comprising:
    bonding a complementary metal oxide semiconductor (CMOS) wafer to the first interconnect structure.

15. The method of claim 14, further comprising:
    forming a deep via vertically extending through, the first interconnect structure, the first and second multi-layered stacks and the source line, the deep via electrically connected the first and second memory strings to the CMOS wafer.

16. The method of claim 14, further comprising:
    forming a metal plug vertically extending through first and second multi-layered stacks and the source line, the metal plug electrically connected the first and second memory strings to the CMOS wafer.

17. The method of claim 11, wherein the first interconnect structure comprises a first bit line, the second interconnect structure comprises a second bit line, the first and second bit line are made of copper.

* * * * *